(12) United States Patent
Jones et al.

(10) Patent No.: US 10,454,388 B2
(45) Date of Patent: *Oct. 22, 2019

(54) POWER CONVERTER

(71) Applicant: ATSE, LLC, Northborough, MA (US)

(72) Inventors: Franklin B. Jones, Shrewsbury, MA (US); Andrew I. Nehring, Northborough, MA (US); Daniel T. Jones, Medford, MA (US); Robert A. Hummel, Cambridge, MA (US); Eric D. Donahue, Sterling, MA (US)

(73) Assignee: ATSE, LLC, Northborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/010,119

(22) Filed: Jun. 15, 2018

(65) Prior Publication Data
US 2018/0309388 A1      Oct. 25, 2018

Related U.S. Application Data

(63) Continuation of application No. 15/398,756, filed on Jan. 5, 2017, now Pat. No. 10,027,251.
(Continued)

(51) Int. Cl.
*H02M 7/537* (2006.01)
*H02M 3/158* (2006.01)
(Continued)

(52) U.S. Cl.
CPC .......... *H02M 7/537* (2013.01); *H02M 3/158* (2013.01); *H02M 7/003* (2013.01); *H02M 7/217* (2013.01); *H05K 7/20927* (2013.01)

(58) Field of Classification Search
CPC ............... H02M 3/28; H02M 3/33507; H02M 3/33569; H02M 3/33561; H02M 3/156;
(Continued)

(56) References Cited

U.S. PATENT DOCUMENTS

| 8,102,235 B2 | 1/2012 | Hui et al. |
| 8,520,417 B2 | 8/2013 | Erdman et al. |

(Continued)

OTHER PUBLICATIONS

Non-Final Office Action in U.S. Appl. No. 15/398,756, dated May 24, 2017; 11 pages.
(Continued)

*Primary Examiner* — Jue Zhang
*Assistant Examiner* — Kevin H Sprenger
(74) *Attorney, Agent, or Firm* — Schmeiser, Olsen & Watts LLP; Timothy P. Collins

(57) ABSTRACT

A power inverter comprises a plurality of high power switching modules that form an alternating current (AC) output; a plurality of terminals in communication with the high power switching modules for outputting the AC output; a capacitor bank that provides a conditioned voltage to the high power switching modules for producing the AC output in response to receiving and storing electrical energy related to a direct current (DC) supply; and a case positioned over the high power switching modules. The capacitor bank is mounted to the case, and the capacitor bank is positioned over the high power switching modules so that the high power switching terminals are proximal the capacitor bank for reducing inductance. A gate driver module at a top region of the high power switching modules includes a plurality of planar transformers for reducing a distance between the capacitor bank and the gate driver.

16 Claims, 41 Drawing Sheets

Related U.S. Application Data

(60) Provisional application No. 62/274,872, filed on Jan. 5, 2016.

(51) Int. Cl.
    *H02M 7/217*     (2006.01)
    *H02M 7/00*     (2006.01)
    *H05K 7/20*     (2006.01)

(58) Field of Classification Search
    CPC ........... H02M 3/33592; H02M 3/3376; H02M 3/337; H02M 3/33523; H02M 3/3384; H02M 7/7575; H02M 7/537; H02M 7/003; H02M 7/5387; H02M 7/538; H02M 7/53871; H02M 7/53875; H02M 7/5381; H02M 7/53806; H02M 7/53846; H02M 5/4585; H02M 5/458; H02M 5/447; H02M 5/45; H02M 5/4505; H02M 5/005; H02M 1/12; Y02B 70/1433; Y02B 70/126; Y02B 70/1475; Y02B 70/1441; H02J 9/062; H02J 3/36; H02H 7/268; H01L 23/473; H01L 2924/3011; H01L 2924/30107; H01R 13/6675
See application file for complete search history.

(56) References Cited

U.S. PATENT DOCUMENTS

| | | |
|---|---|---|
| 2005/0111246 A1 | 5/2005 | Lai et al. |
| 2005/0270806 A1 | 12/2005 | Zhu |
| 2007/0007929 A1 | 1/2007 | Lee et al. |
| 2008/0205089 A1* | 8/2008 | Zhu .................. H02M 3/33507 363/17 |
| 2009/0128237 A1 | 5/2009 | Attwood et al. |
| 2015/0131353 A1* | 5/2015 | Nakajima ............ H05K 7/2039 363/141 |

OTHER PUBLICATIONS

Final Office Action in U.S. Appl. No. 15/398,756, dated Nov. 29, 2017; 10 pages.
Notice of Allowance in U.S. Appl. No. 15/398,756, dated Mar. 27, 2018; 10 pages.

\* cited by examiner

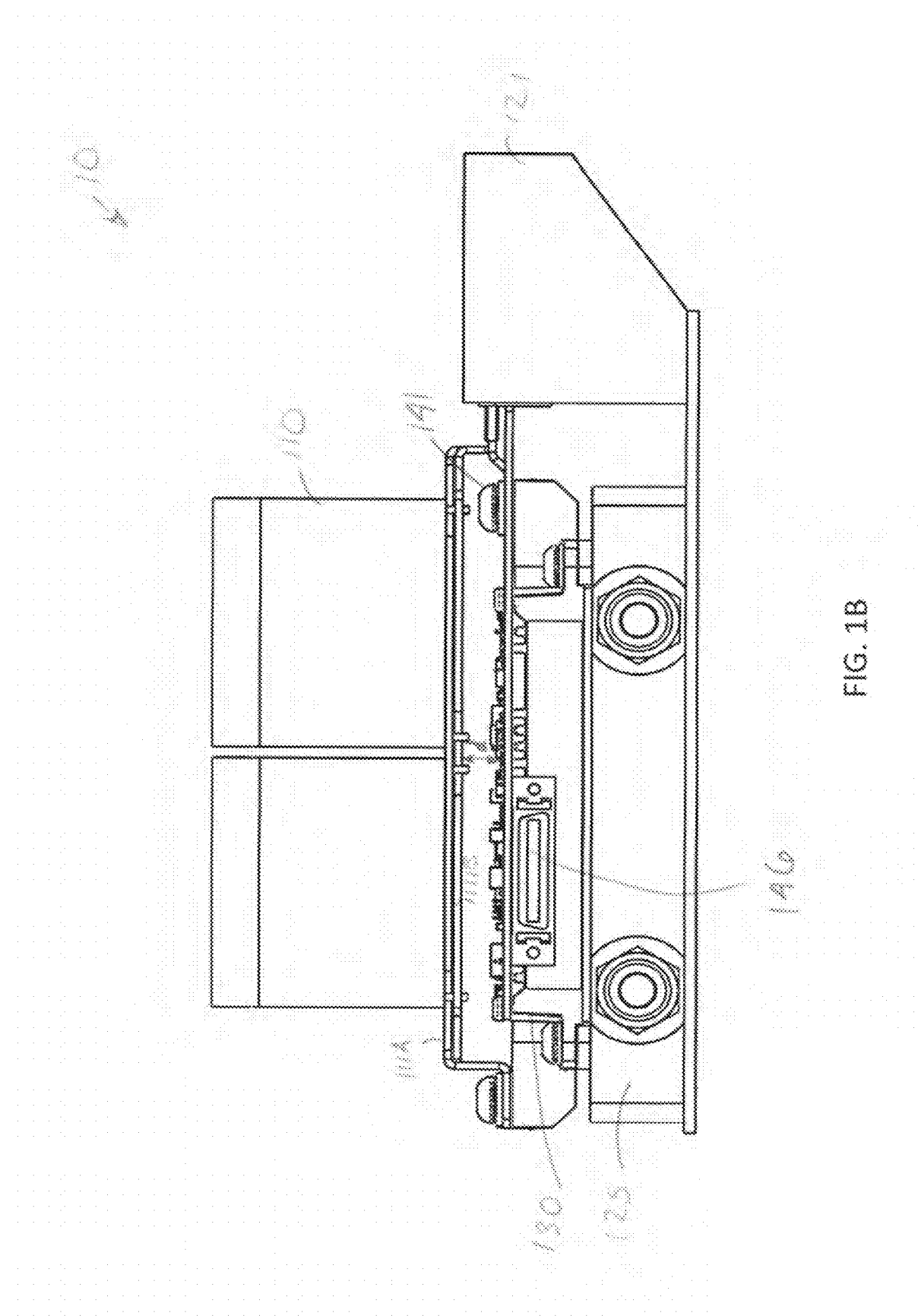

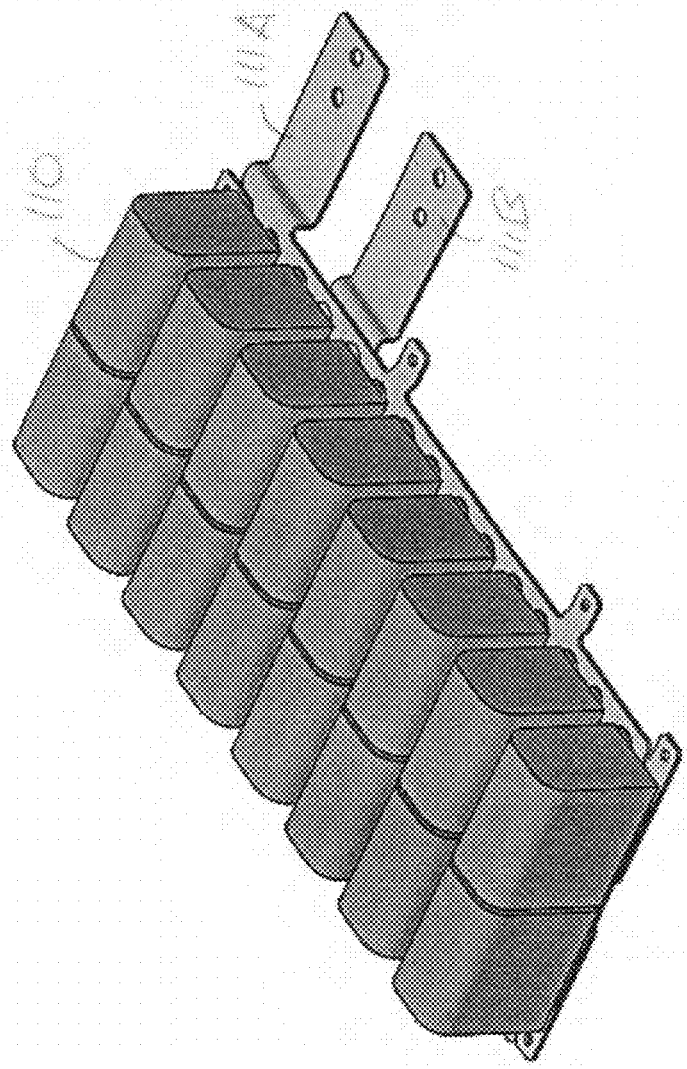

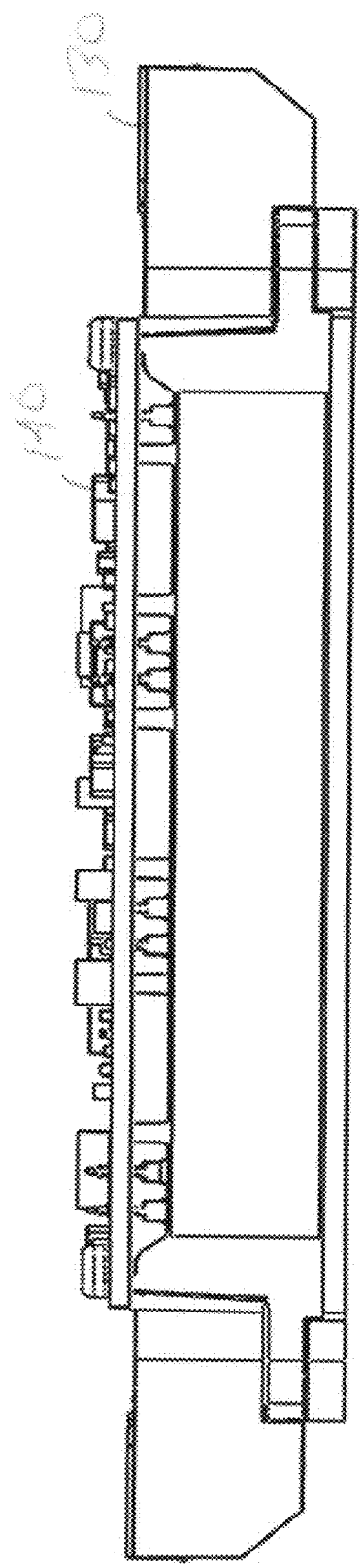

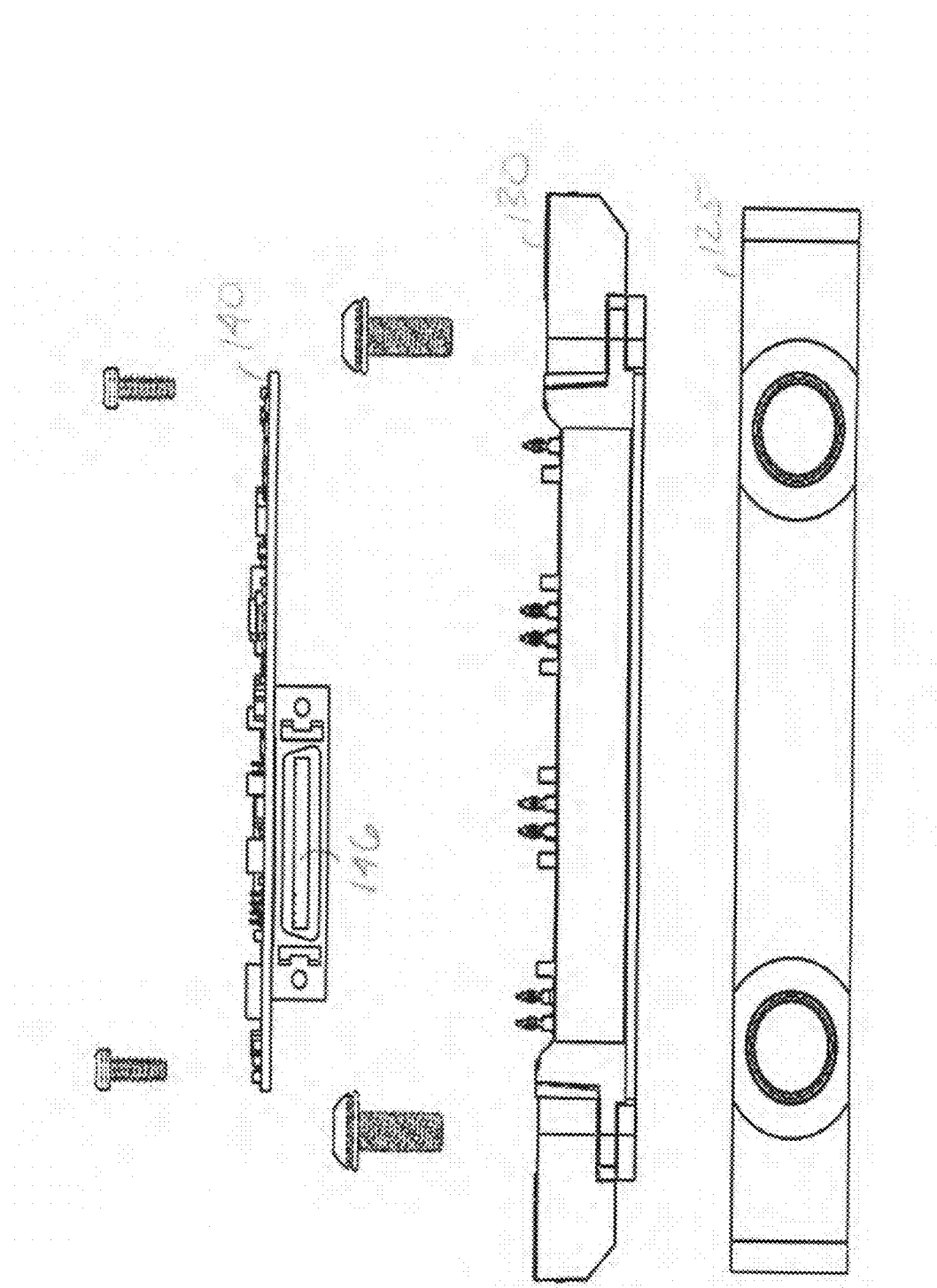

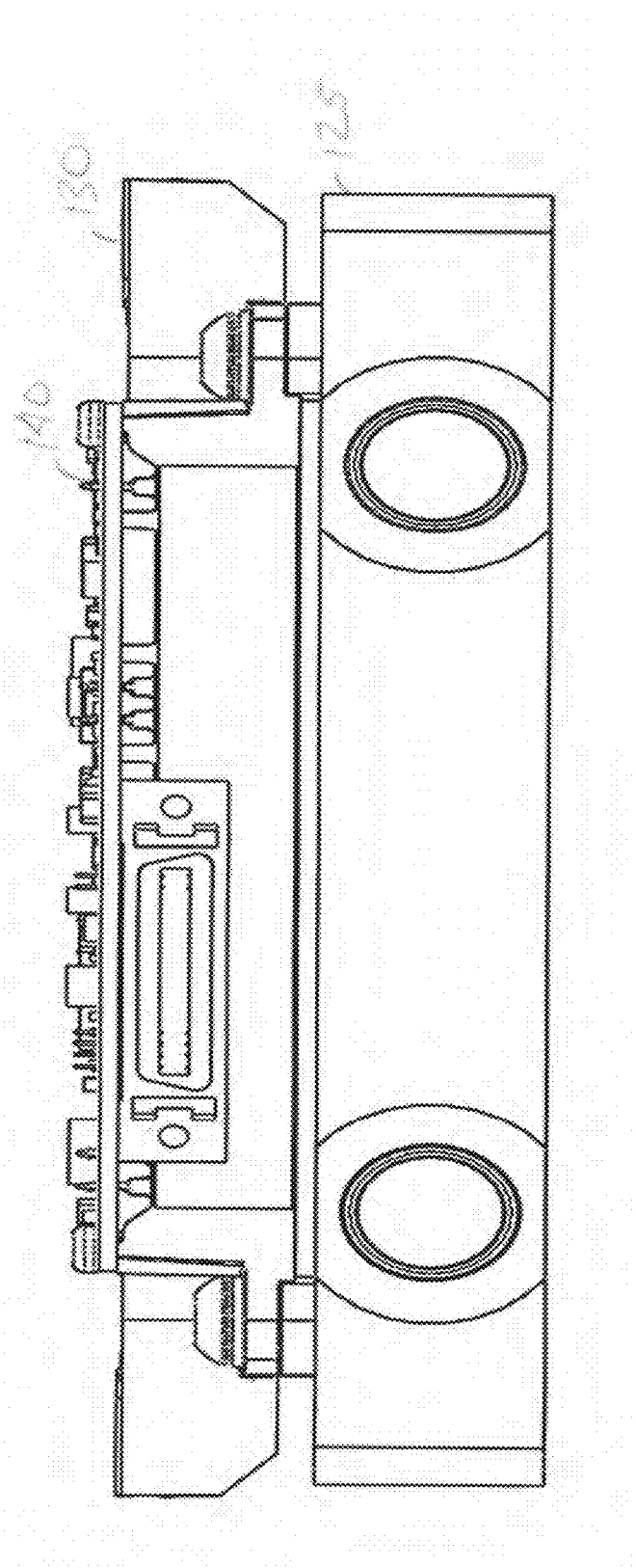

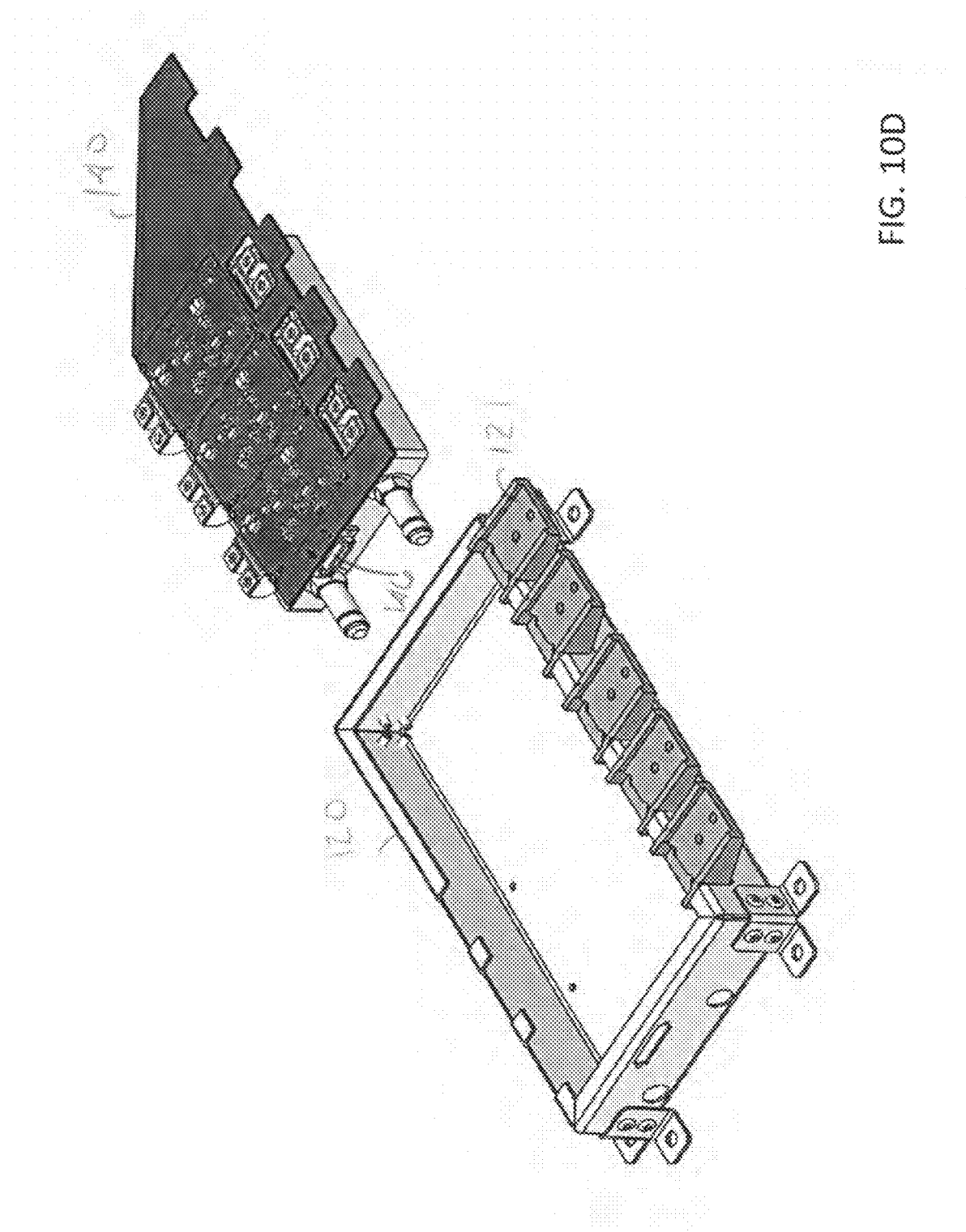

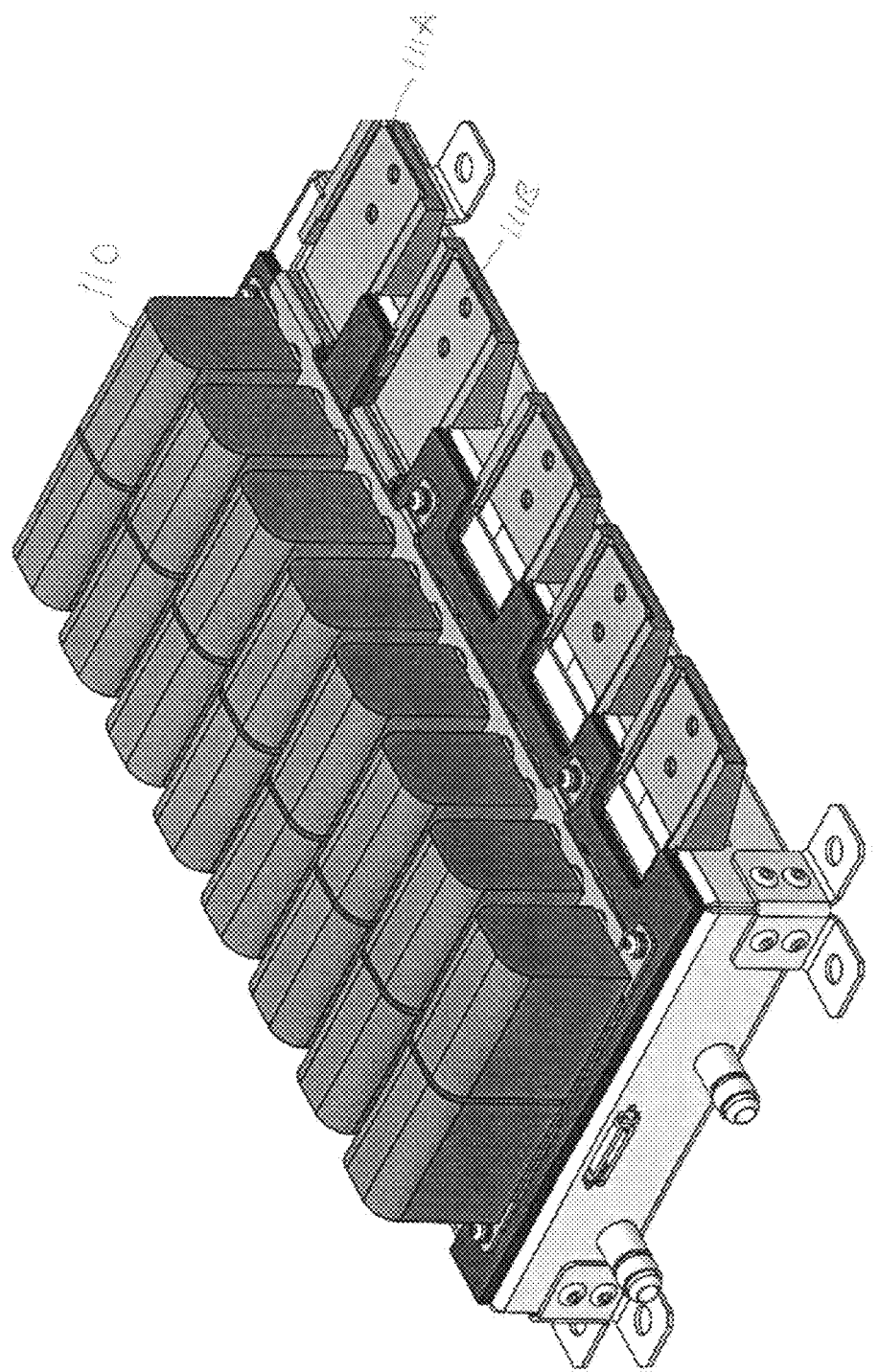

POWER CONVERTER

RELATED APPLICATIONS

This application is a continuation of U.S. patent application Ser. No. 15/398,756 filed Jan. 5, 2017 and entitled "Power Converter", which claims the benefit of U.S. Provisional Patent Application No. 62/274,872 filed Jan. 5, 2016 and entitled "Power Inverter," the contents of each of which is incorporated herein in their entirety.

FIELD

The present concepts relate generally to power converters, and more specifically, to packaging and component arrangements for a power converter.

BACKGROUND

Power inverters are well-known for receiving electrical power from a generator or other power source, and conditioning the electrical power such as converting the received power from direct current (DC) to alternating current (AC), AC to DC, or DC to DC at a different voltage. Issues related to high inductance may occur between components of a conventional power converter.

BRIEF SUMMARY

In one aspect, provided is a power inverter, comprising: a plurality of high power switching modules that form an alternating current (AC) output; a plurality of terminals in communication with the high power switching modules for outputting the AC output; a capacitor bank that provides a conditioned voltage to the high power switching modules for producing the AC output in response to receiving and storing electrical energy related to a direct current (DC) supply; and a case positioned over the high power switching modules, wherein the capacitor bank is mounted to the case, and the capacitor bank is positioned over the high power switching modules so that the high power switching terminals are proximal the capacitor bank.

In another aspect, provided is a power inverter, comprising: a plurality of high power switching modules that form an alternating current (AC) output, the high power switching modules including a plurality of terminals for outputting the AC output; a capacitor bank that provides a conditioned voltage to the high power switching modules for producing the AC output in response to receiving and storing electrical energy related to a direct current (DC) supply; and a gate driver module at a top region of the high power switching modules, the gate driver module including a plurality of planar transformers for reducing a distance between the capacitor bank and the gate driver.

In another aspect, provided is a power converter, comprising: a plurality of insulated gate bipolar transistor (IGBT) modules that convert one form of electrical current to another form of electrical current according to an operating mode; a plurality of terminals for outputting the converted form of electrical current; and a gate driver module at a top region of the high power switching modules, the gate driver module including a plurality of planar transformers.

BRIEF DESCRIPTION OF THE SEVERAL VIEWS OF THE DRAWINGS

The above and further advantages may be better understood by referring to the following description in conjunction with the accompanying drawings, in which like numerals indicate like structural elements and features in various figures. The drawings are not necessarily to scale, emphasis instead being placed upon illustrating the principles of the concepts.

FIG. 1B is a front view of the converter of FIG. 1A.

FIG. 5 is an isometric view of a capacitor bank, in accordance with some embodiments.

FIG. 6B is an isometric view of the IGBT module and gate board module of FIGS. 1A-1F, 3, 4, and 6A coupled together.

FIG. 6C is a side view of the IGBT module and gate board module of FIGS. 1A-1F, 3, 4, 6A, and 6B separate from each other.

FIG. 6D is a side view of the IGBT module and gate board module of FIGS. 1A-1F, 3, 4, and 6A-6C coupled together.

FIG. 8A is a front view of the IGBT module, gate board module, and cold plate of FIGS. 1-7 separate from each other.

FIG. 8B is a front view of the IGBT module, gate board module, and cold plate of FIGS. 1-8A coupled together.

FIGS. 10A-10K are isometric views of steps of a method for assembling an converter, in accordance with some embodiments.

DETAILED DESCRIPTION

Figure 1A:
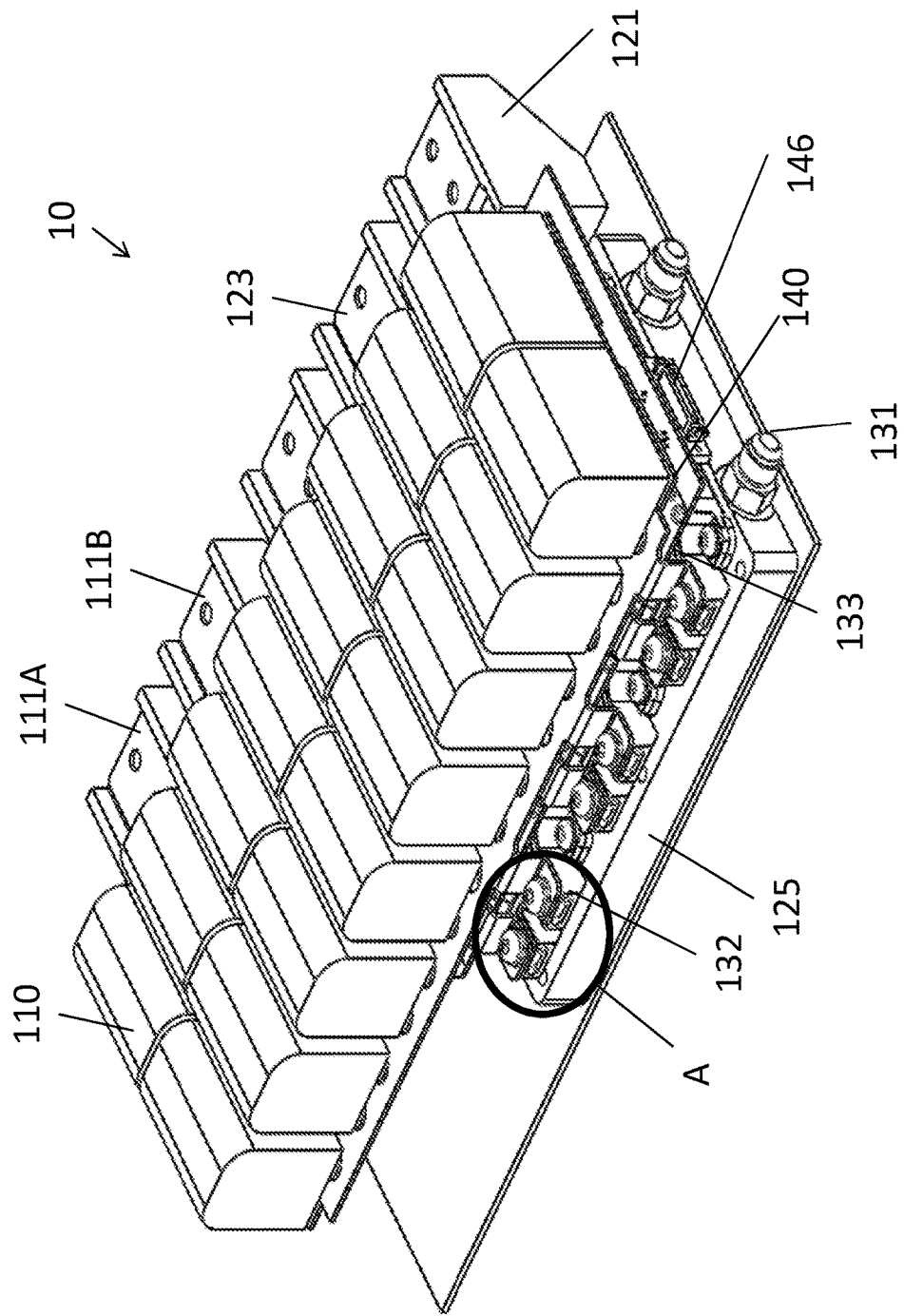
FIG. 1A is an isometric view of a converter, in accordance with some embodiments.
Figure 1C:
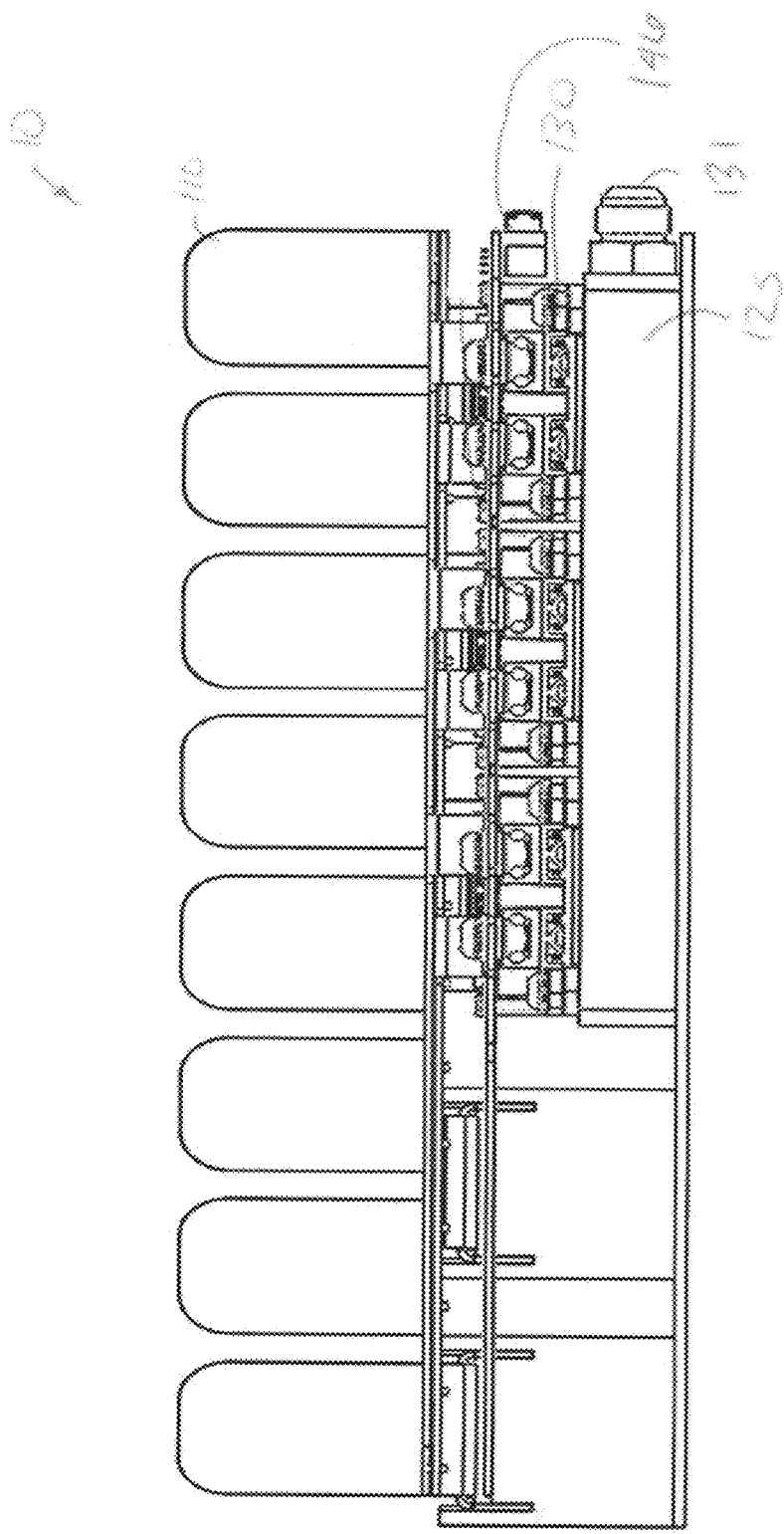
FIG. 1C is a side view of the converter of FIGS. 1A and 1B.
Figure 1D:
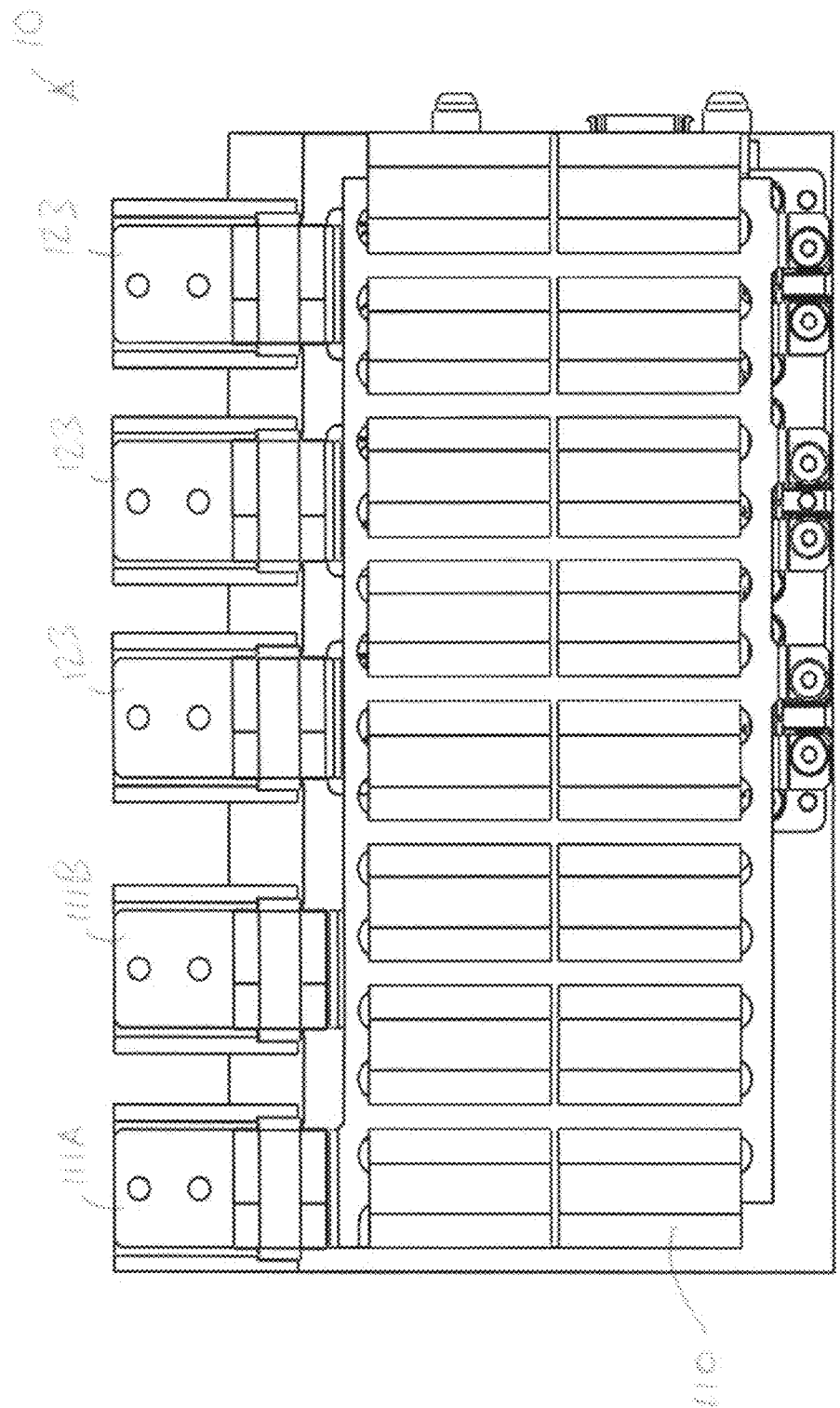
FIG. 1D is a top view of the converter of FIGS. 1A-1C.
Figure 1E:
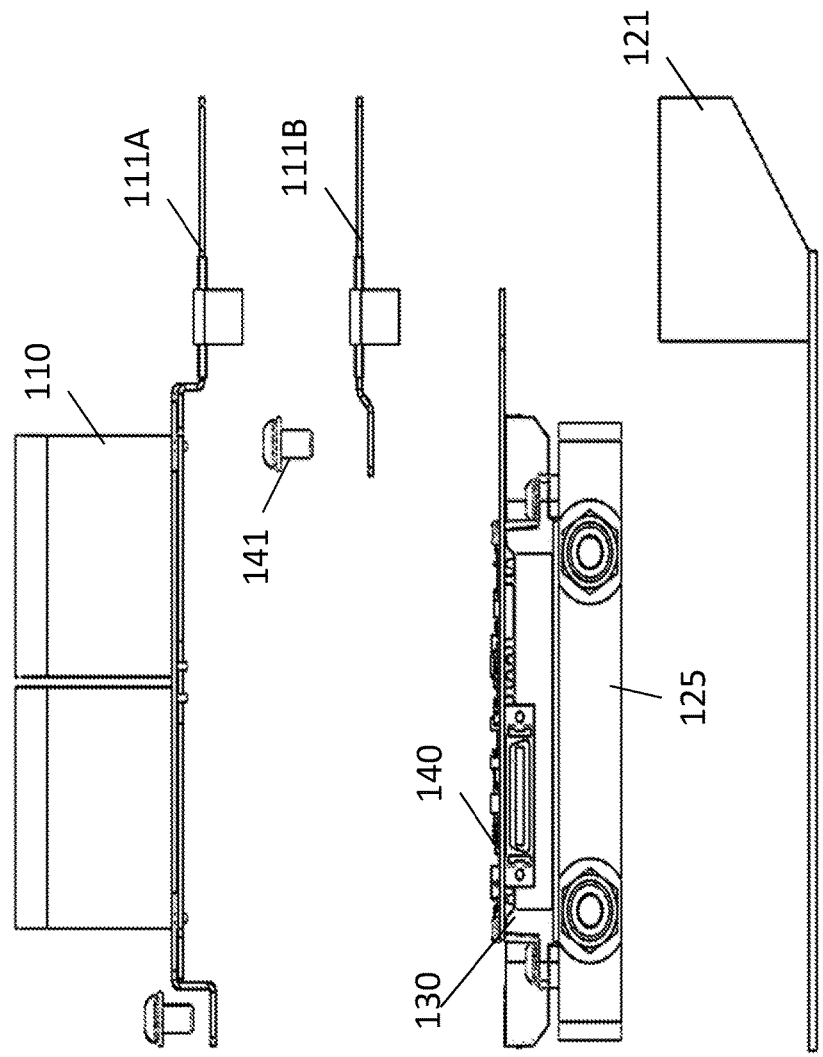
FIG. 1E is an exploded front view of the converter of FIGS. 1A-1D.
Figure 1F:
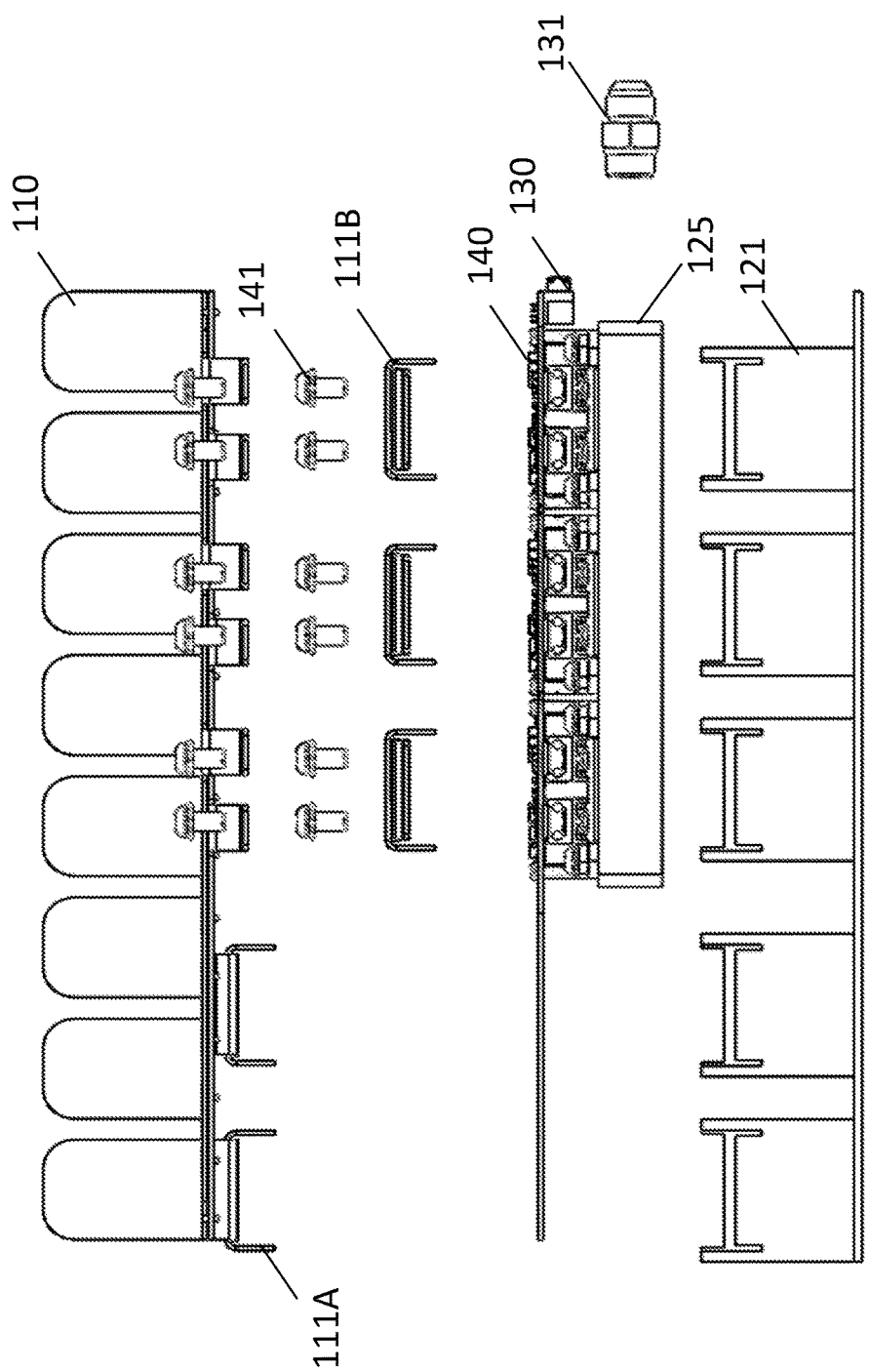
FIG. 1F is an exploded side view of the converter of FIGS. 1A-1E.
Figure 1G:
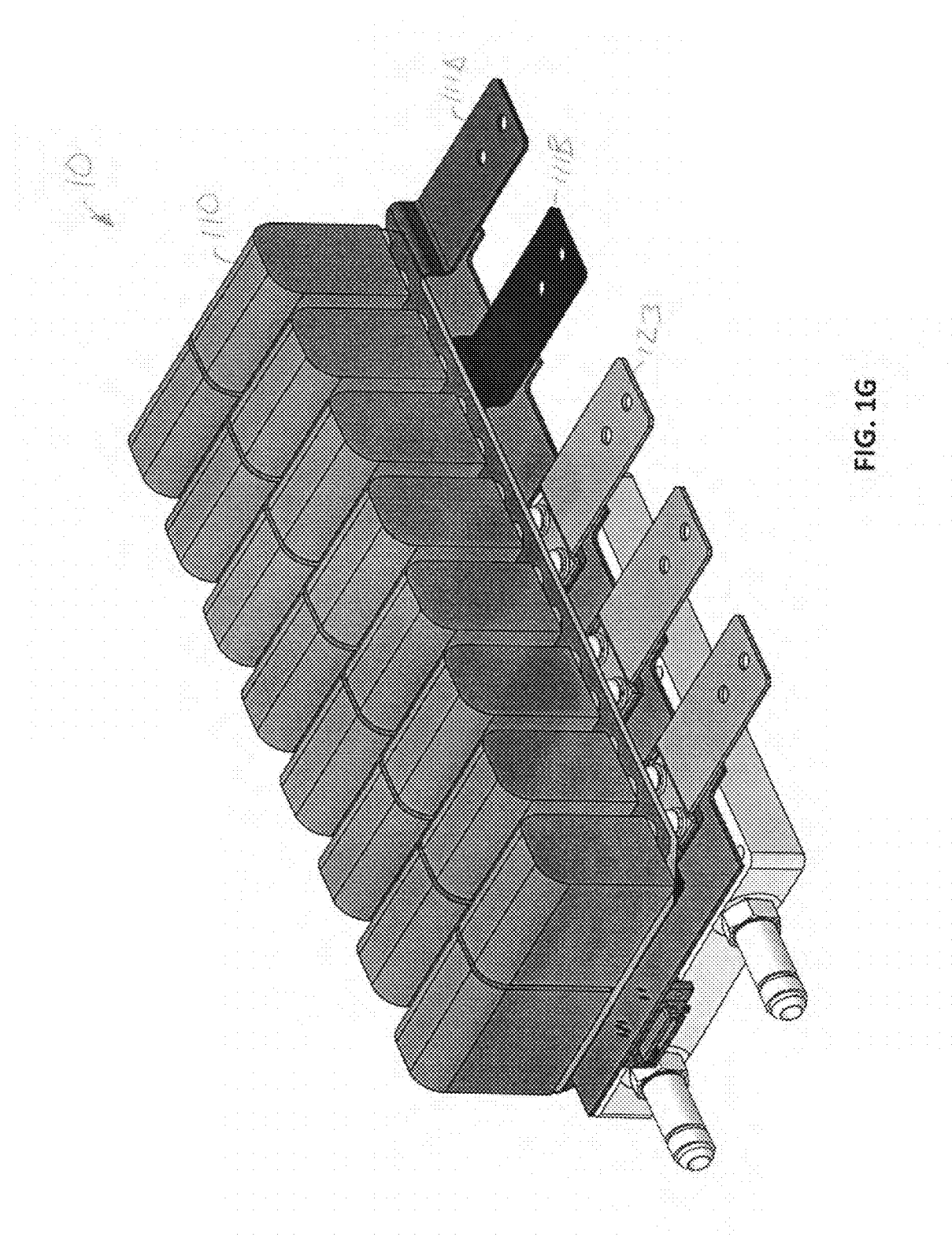
FIG. 1G is a perspective view of a terminal side of the converter of FIGS. 1A-1F.
Figure 1H:
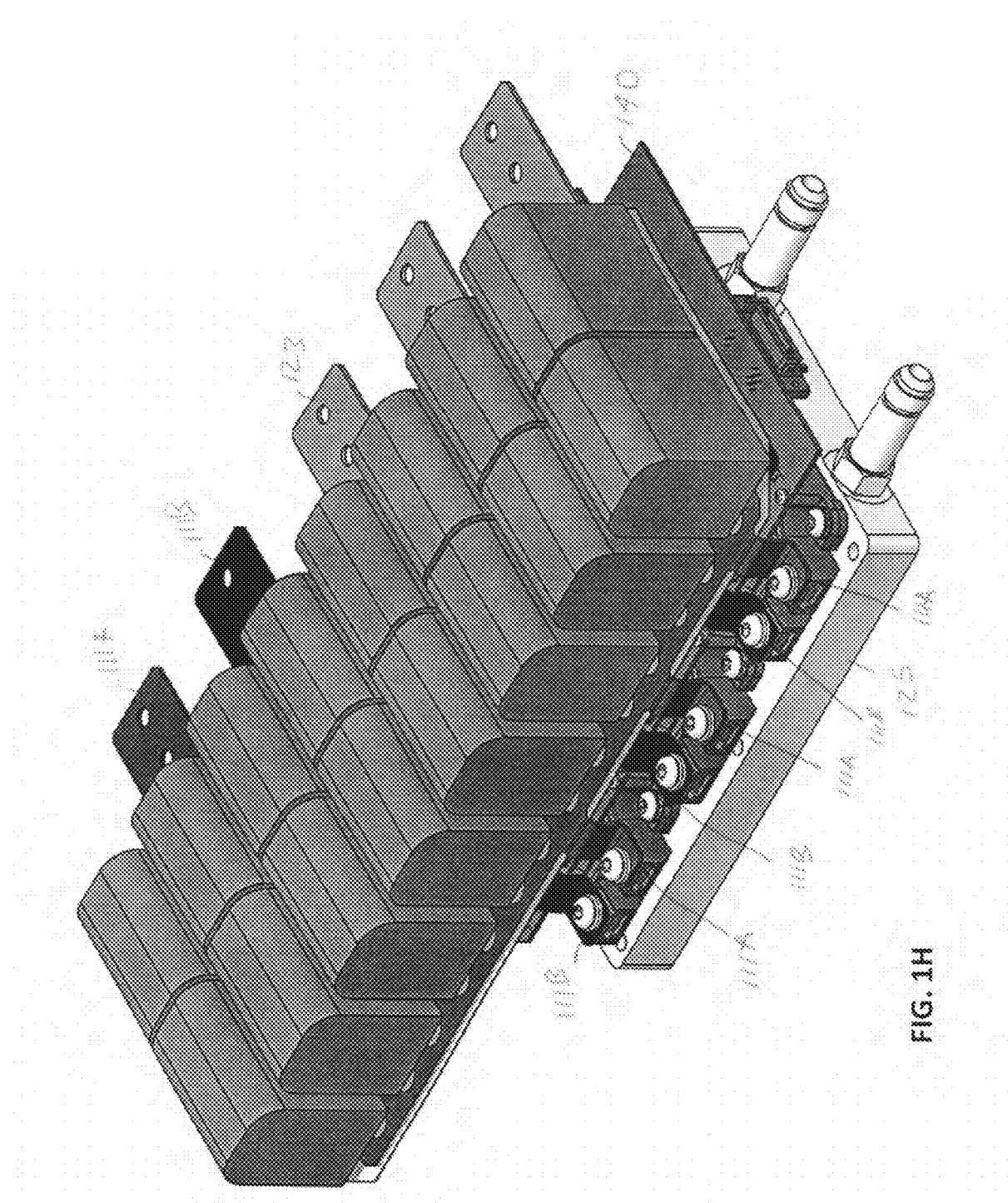
FIG. 1H is another perspective view of the converter of FIGS. 1A-1G.
Figure 2:
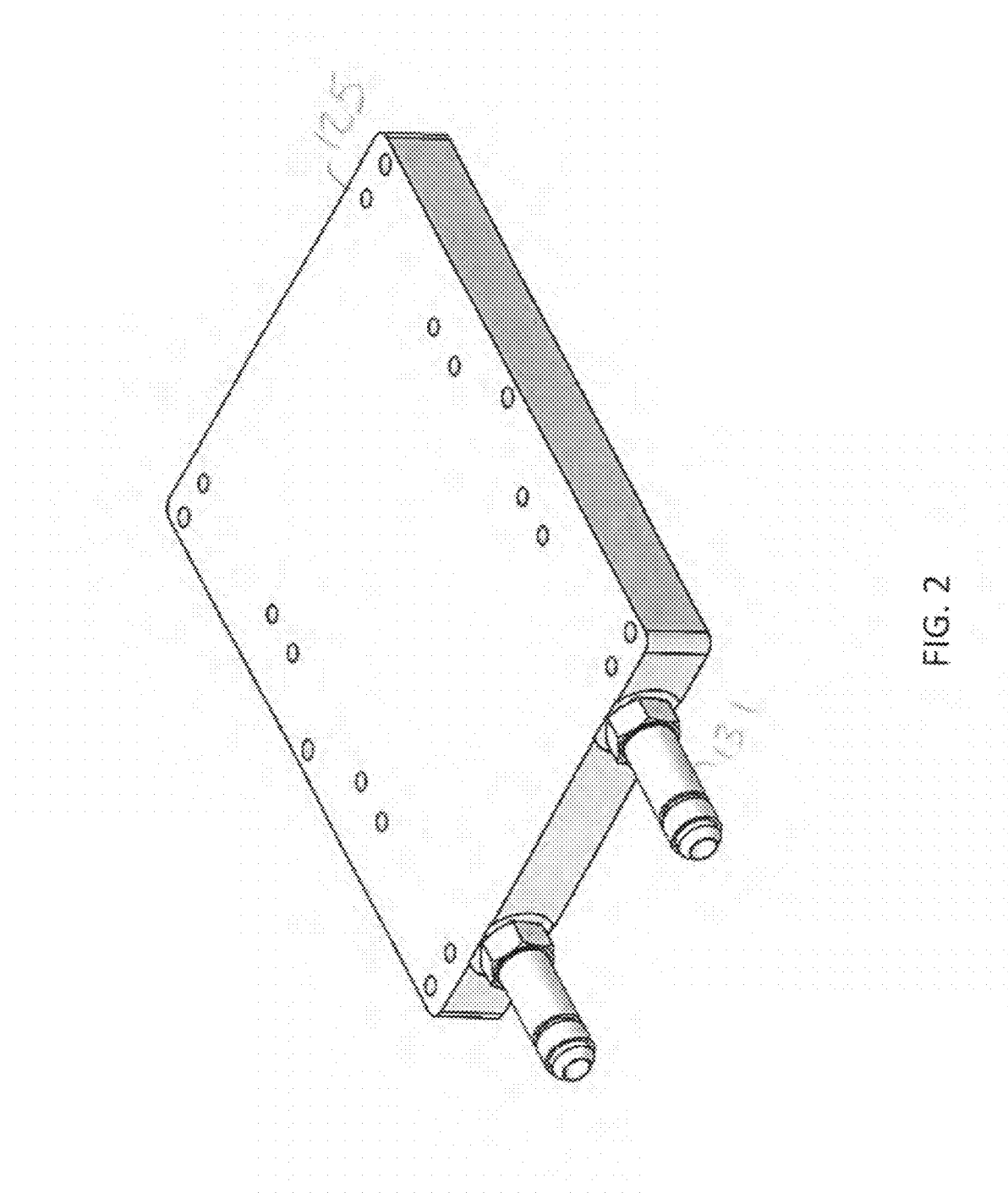
FIG. 2 is an isometric view of a cold plate, in accordance with some embodiments.
Figure 3:
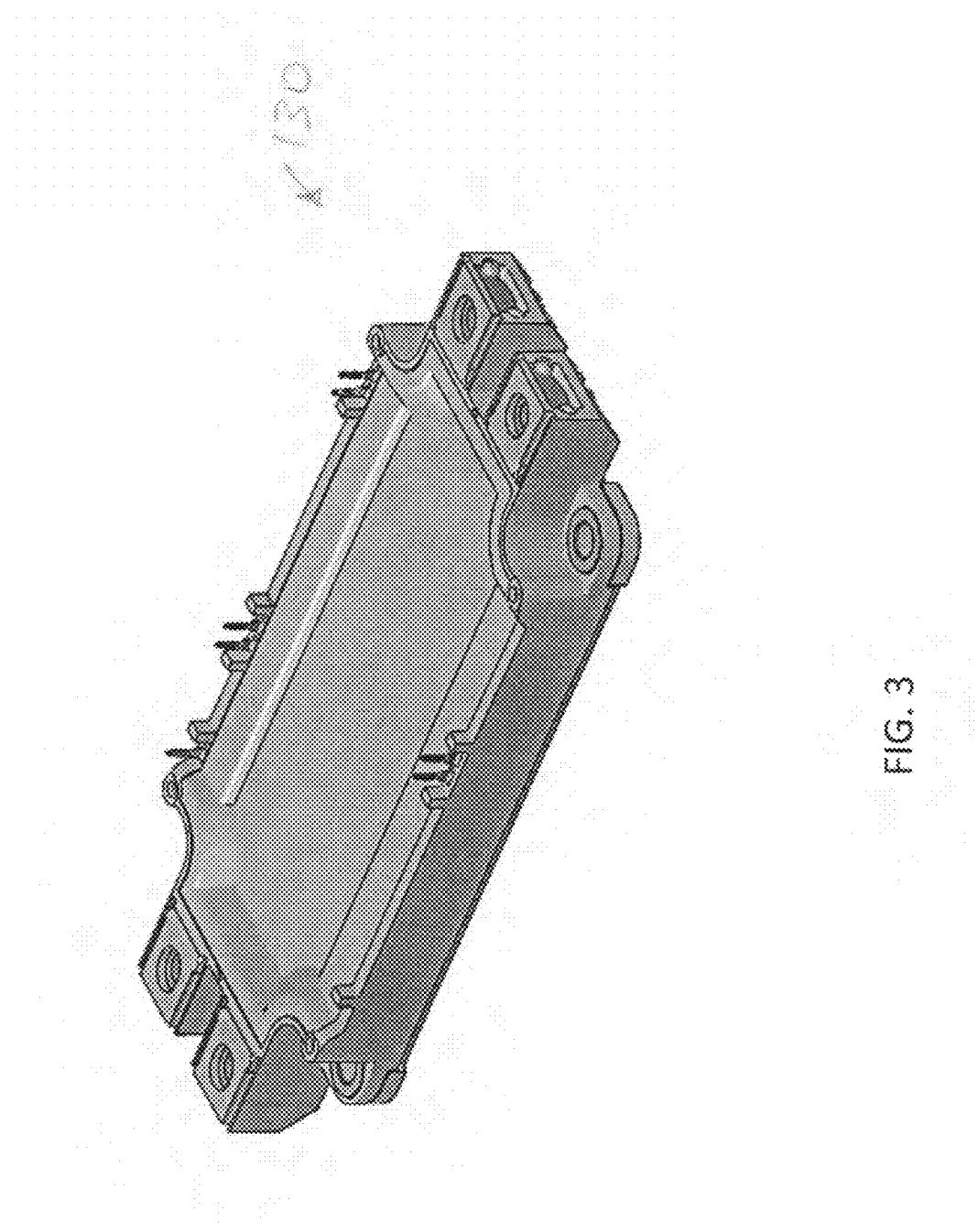
FIG. 3 is an isometric view of an insulated gate bipolar transistor (IGBT) module, in accordance with some embodiments.
Figure 4:
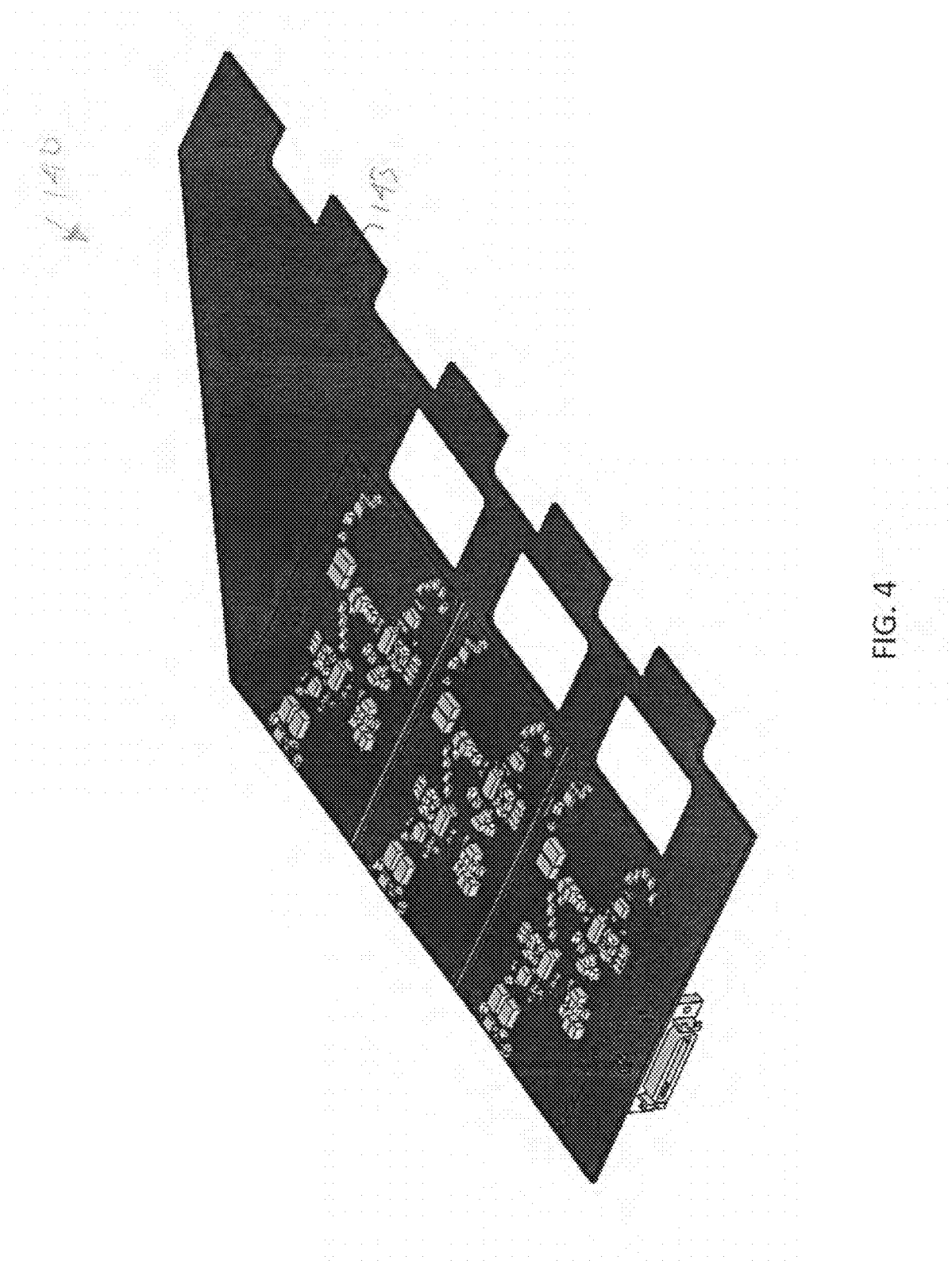
FIG. 4 is an isometric view of a gate driver board, in accordance with some embodiments.
Figure 6A:
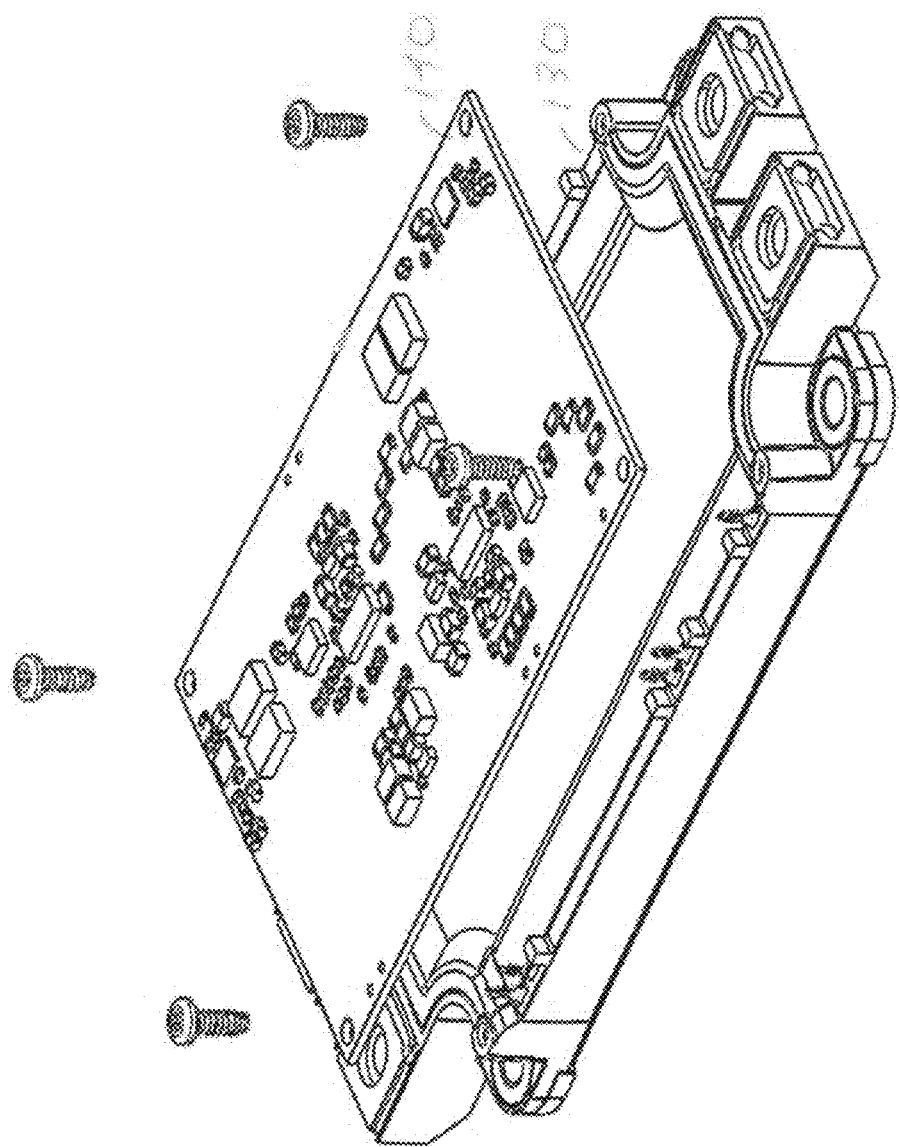
FIG. 6A is an isometric view of the IGBT module and gate board module of FIGS. 1A-1F, 3, and 4 separate from each other.
Figure 46:
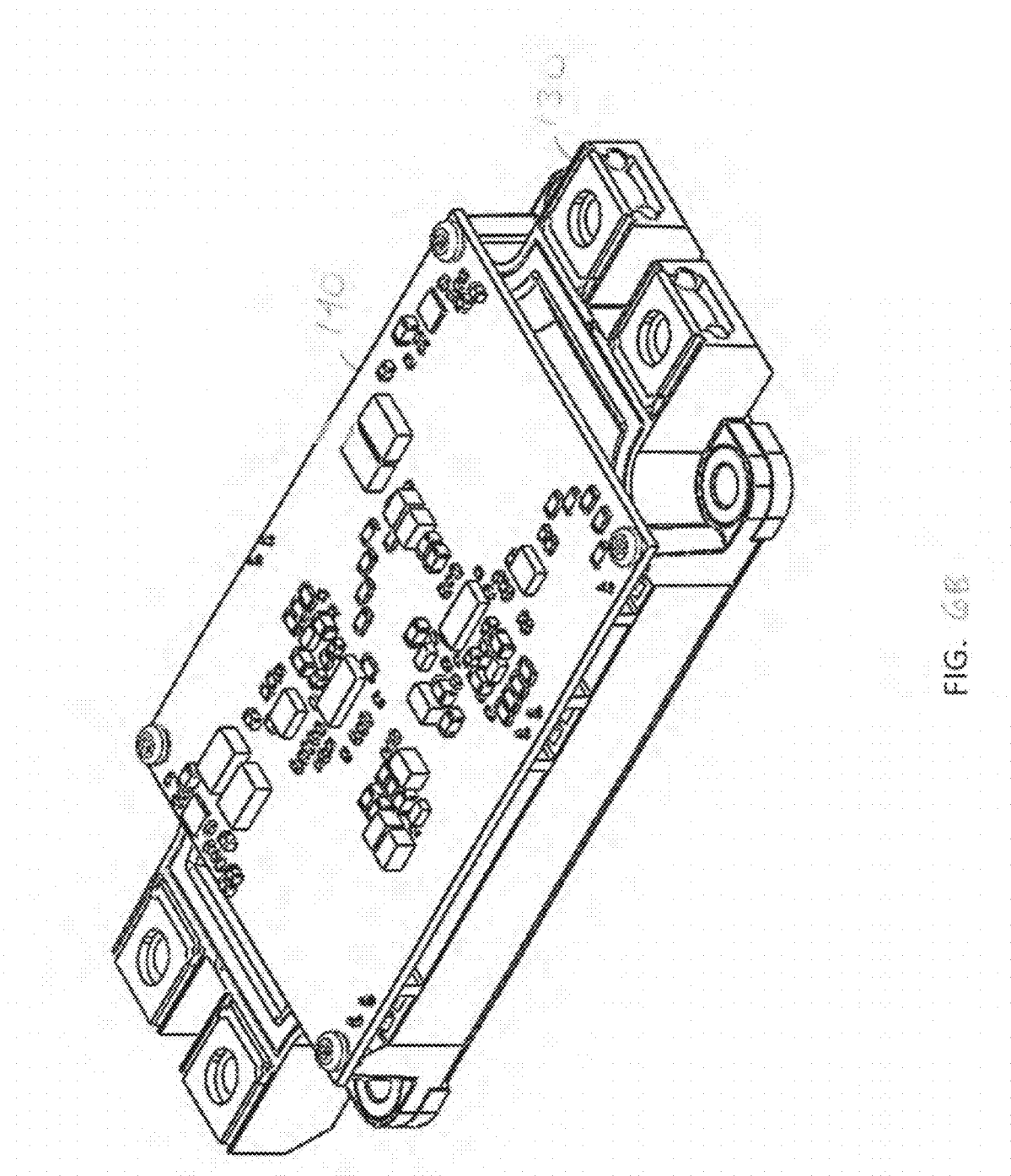
Figure 66:
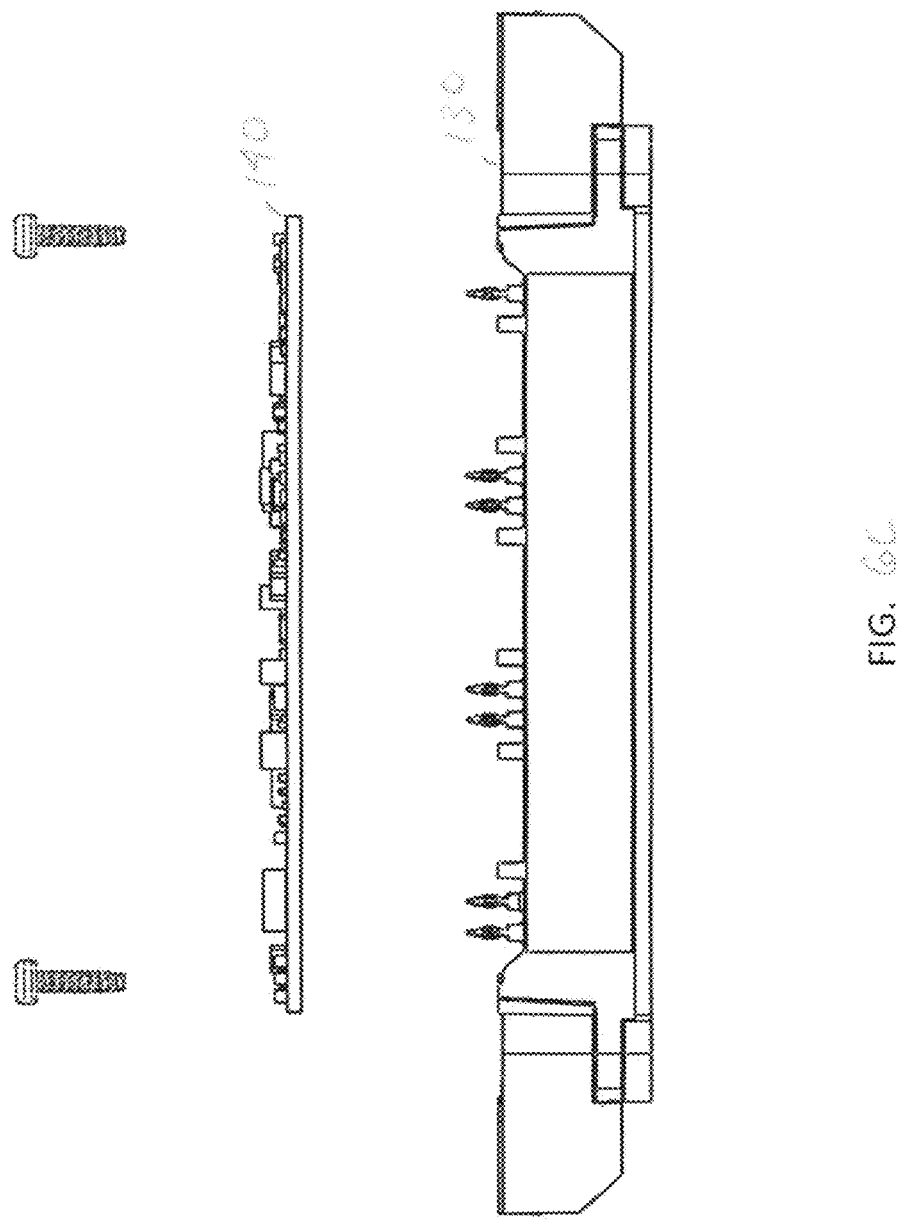
Figure 7:
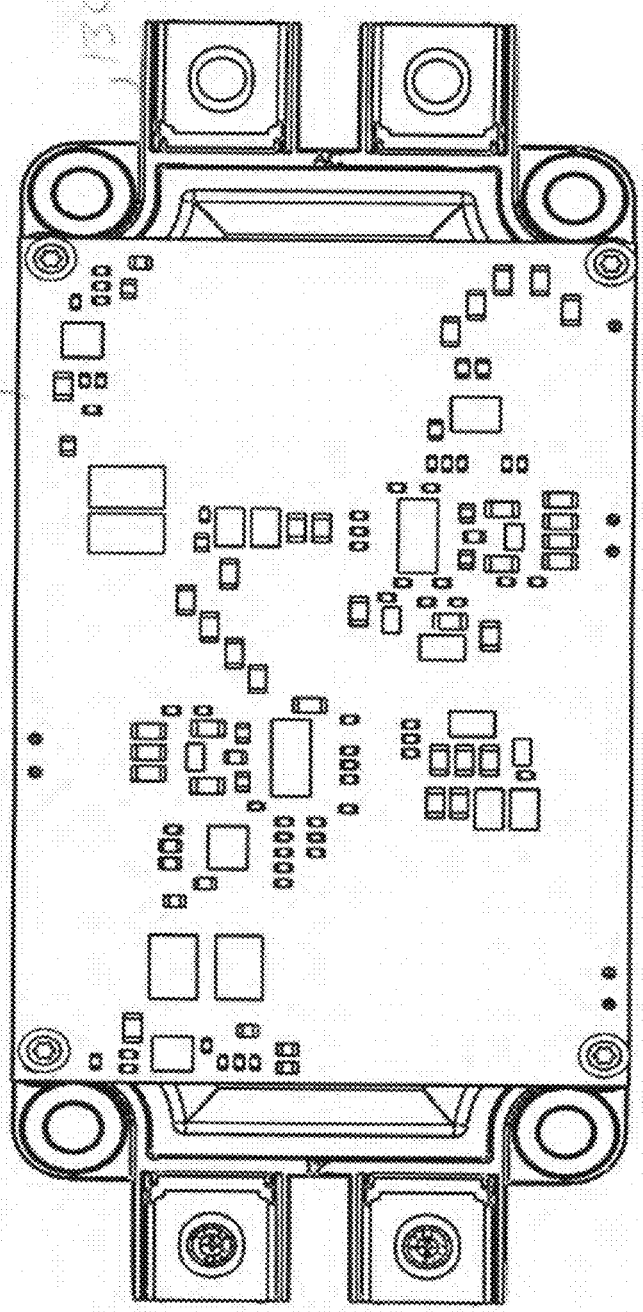
FIG. 7 is a top view of the IGBT module and gate board module of FIGS. 1A-1F, 3, 4, and 6A-6D coupled together.
Figure 8C:
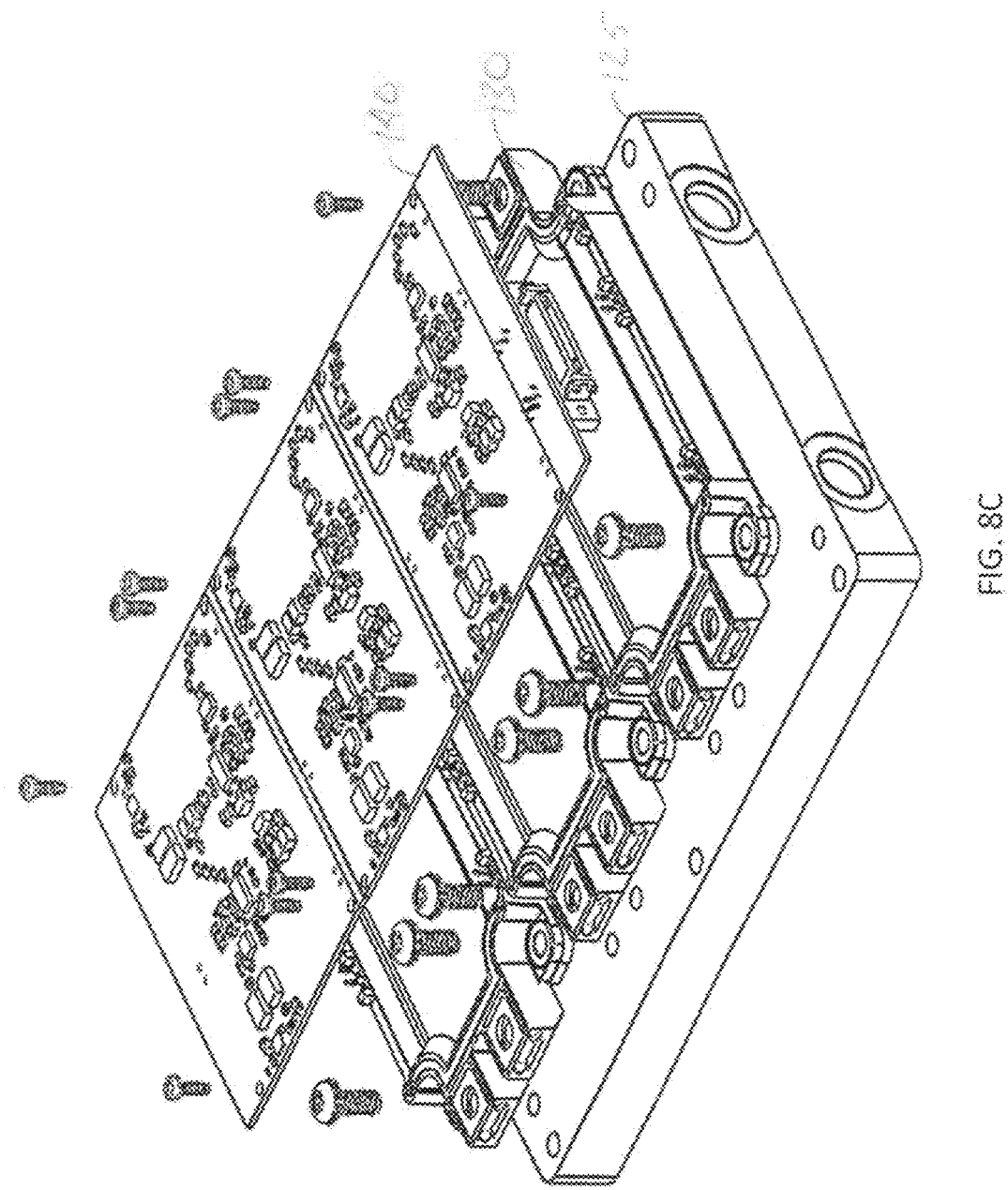
FIG. 8C is an isometric view of the IGBT module, gate board module, and cold plate of FIGS. 1-8B separate from each other.
Figure 8D:
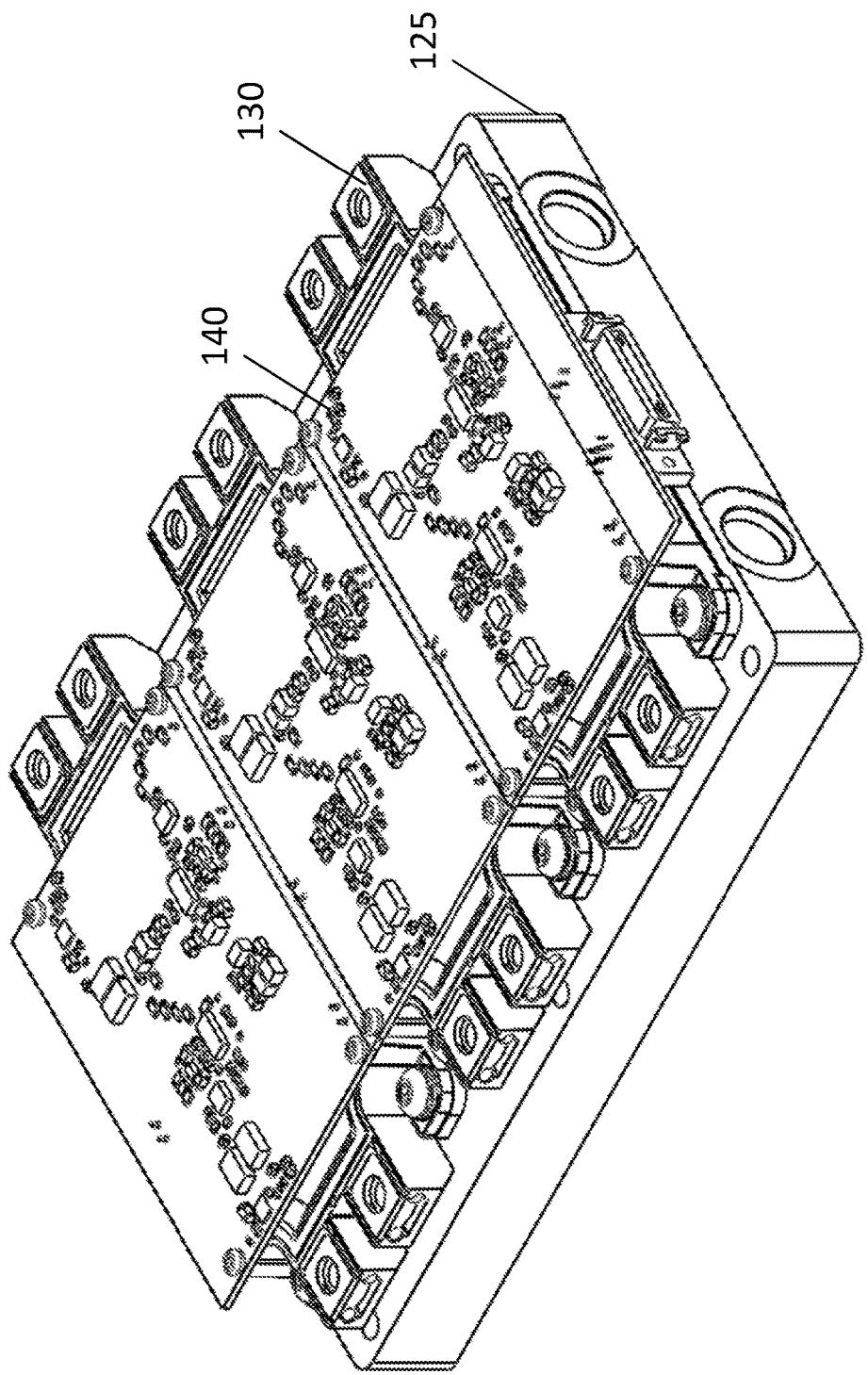
FIG. 8D is an isometric view of the IGBT module, gate board module, and cold plate of FIGS. 1-8C coupled together.
Figure 8E:
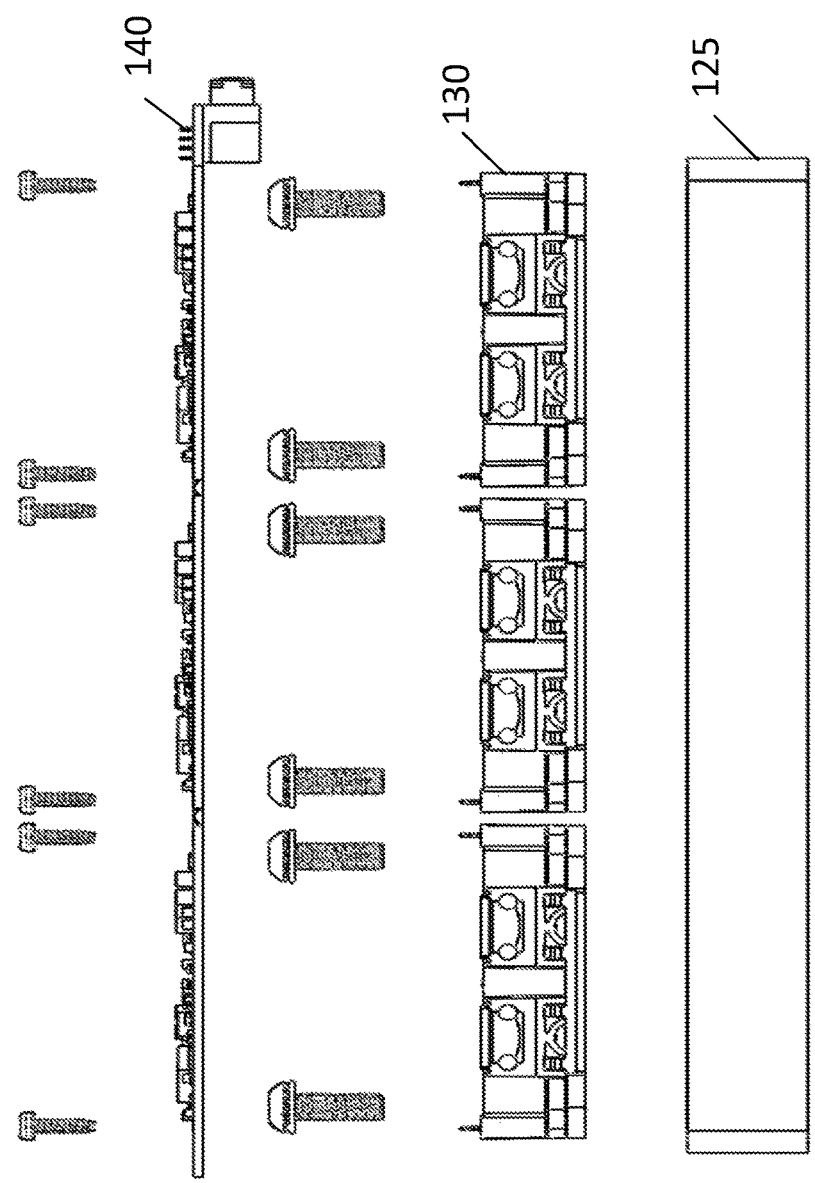
FIG. 8E is a side view of the IGBT module, gate board module, and cold plate of FIGS. 1-8D separate from each other.
Figure 8F:
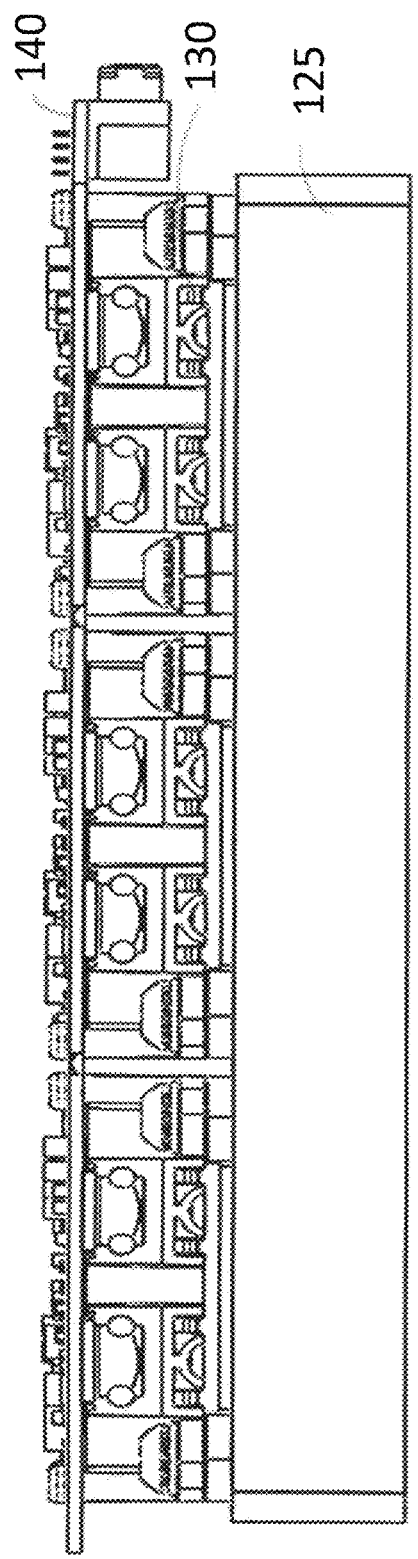
FIG. 8F is a side view of the IGBT module, gate board module, and cold plate of FIGS. 1-8E coupled together.
Figure 8G:
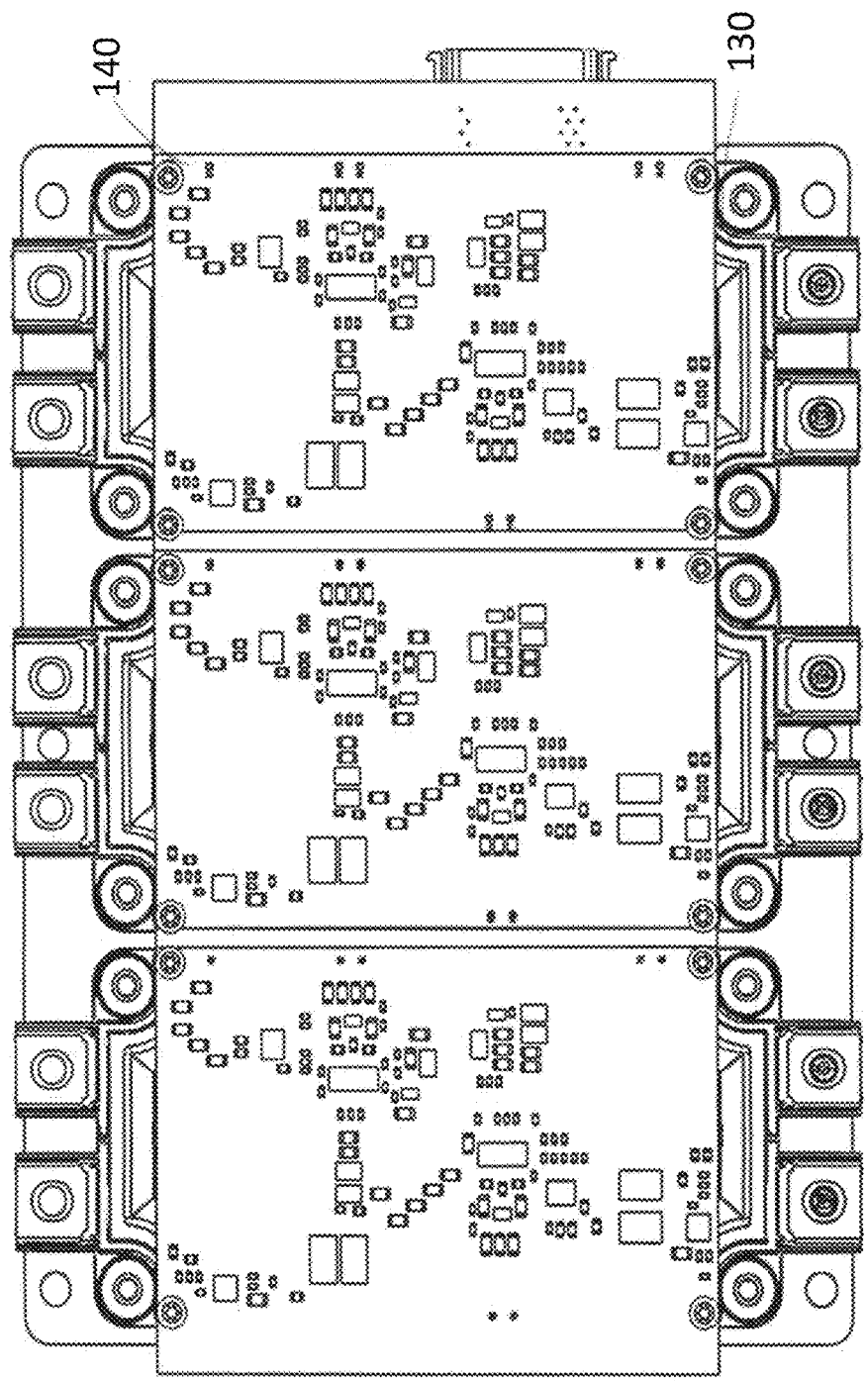
FIG. 8G is a top view of the IGBT module, gate board module, and cold plate of FIGS. 1-8F.

FIG. 1A is an isometric view of a power converter 10, in accordance with some embodiments. FIG. 1B is a front view of the converter 10 of FIG. 1A. FIG. 1C is a side view of the converter 10 of FIGS. 1A and 1B. FIG. 1D is a top view of the converter 10 of FIGS. 1A-1C. FIG. 1E is an exploded front view of the converter 10 of FIGS. 1A-1D. FIG. 1F is an exploded side view of the converter 10 of FIGS. 1A-1E. FIGS. 2-5 are views of various elements of the converter 10. FIGS. 6A-6E, 7, and 8A-8G are views of assemblies of various elements of the converter 10.

The converter 10 can convert a DC input into AC, which may be output from the converter 10 via terminals 123 positioned in terminal blocks 121. In other embodiments, the converter 10 may convert an AC input into DC. In other embodiments, the converter 10 may convert a DC input into DC. Thus, terminals 123 may be AC output terminals in an inverter mode (DC/AC), AC inputs in a rectifier mode (AC/DC), or DC outputs for a DC/DC mode. Accordingly, one or more of the foregoing modes, and/or other related operation modes, may be offered. The terminal blocks 121 may be coupled to a substrate or related sheet on which the cold plate 125 and other elements of the converter 10 may be positioned.

In some embodiments, the converter 10 comprises an array of capacitors 110, a plurality of high power switching modules 130, for example, insulated gate bipolar transistor (IGBT) modules, or related solid state devices, and a gate driver board 140, or module or other related configuration. The capacitor array 110 may be mounted to a frame or case 120 shown in FIG. 10C, for positioning over the IGBTs 130. As described herein, the IGBTs 130 can be positioned on a cold plate, heat sink 125, or related heat dissipation surface.

The capacitors in the array 110 may be film capacitors, electrolytic capacitors, or the like for receiving a source of DC, storing a charge corresponding to the received source of DC, and providing a conditioned voltage, which is used by the IGBTs 130 to produce an AC output. The DC source may be a known source such as a battery, power grid, alternative power source, rectifier, and so on. The capacitors 110 may have a cylindrical, rectangular, or other configuration. The capacitors 110 may have a same, similar, or different configuration with respect to each other. The capacitors in the array 110 are constructed and arranged for providing a total capacitance suitable for charging and discharging according to power requirements imposed on the converter 10.

Figure 12A:
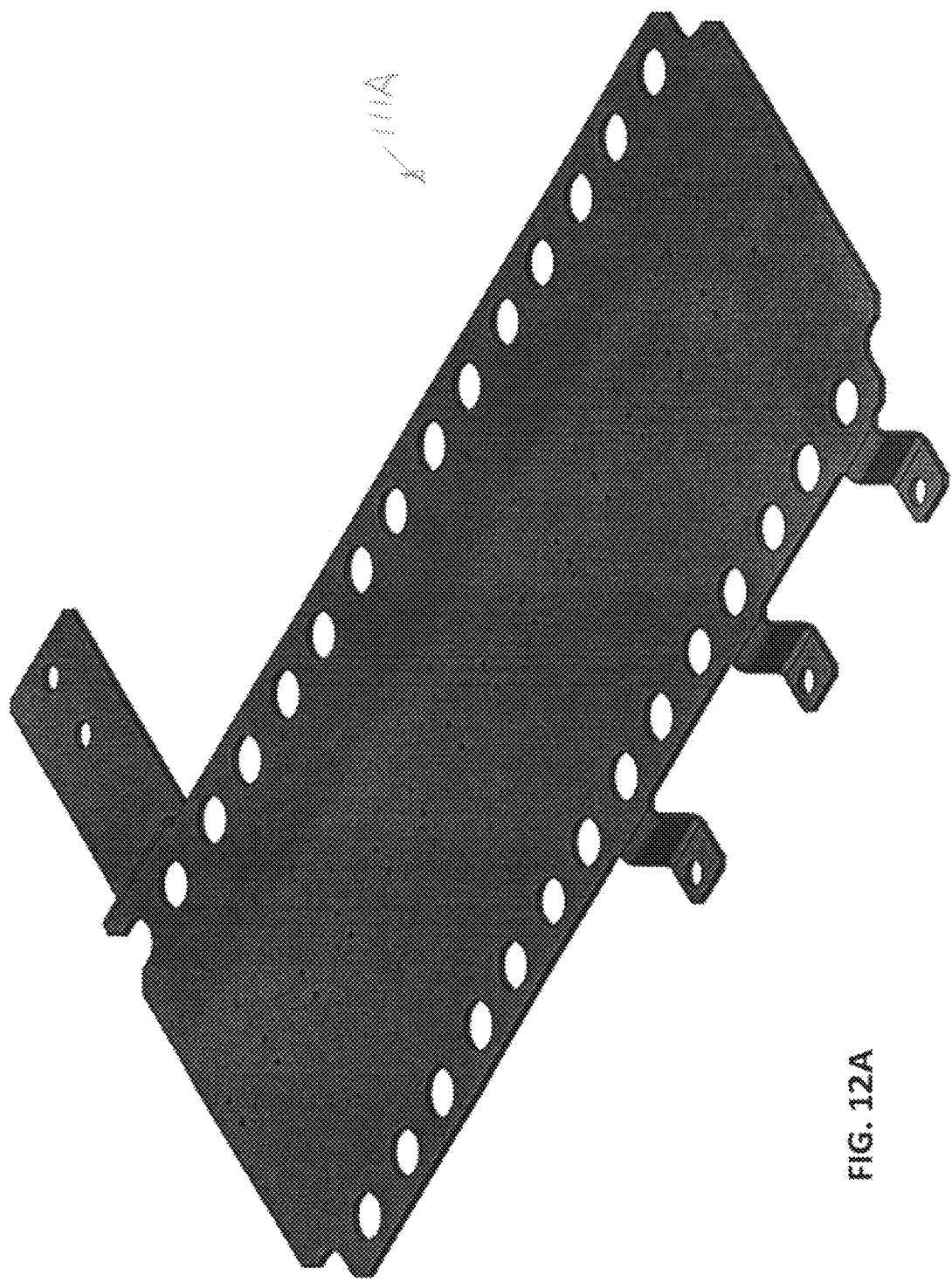
FIG. 12A is a view of a DC+ busbar, in accordance with some embodiments.
Figure 12B:
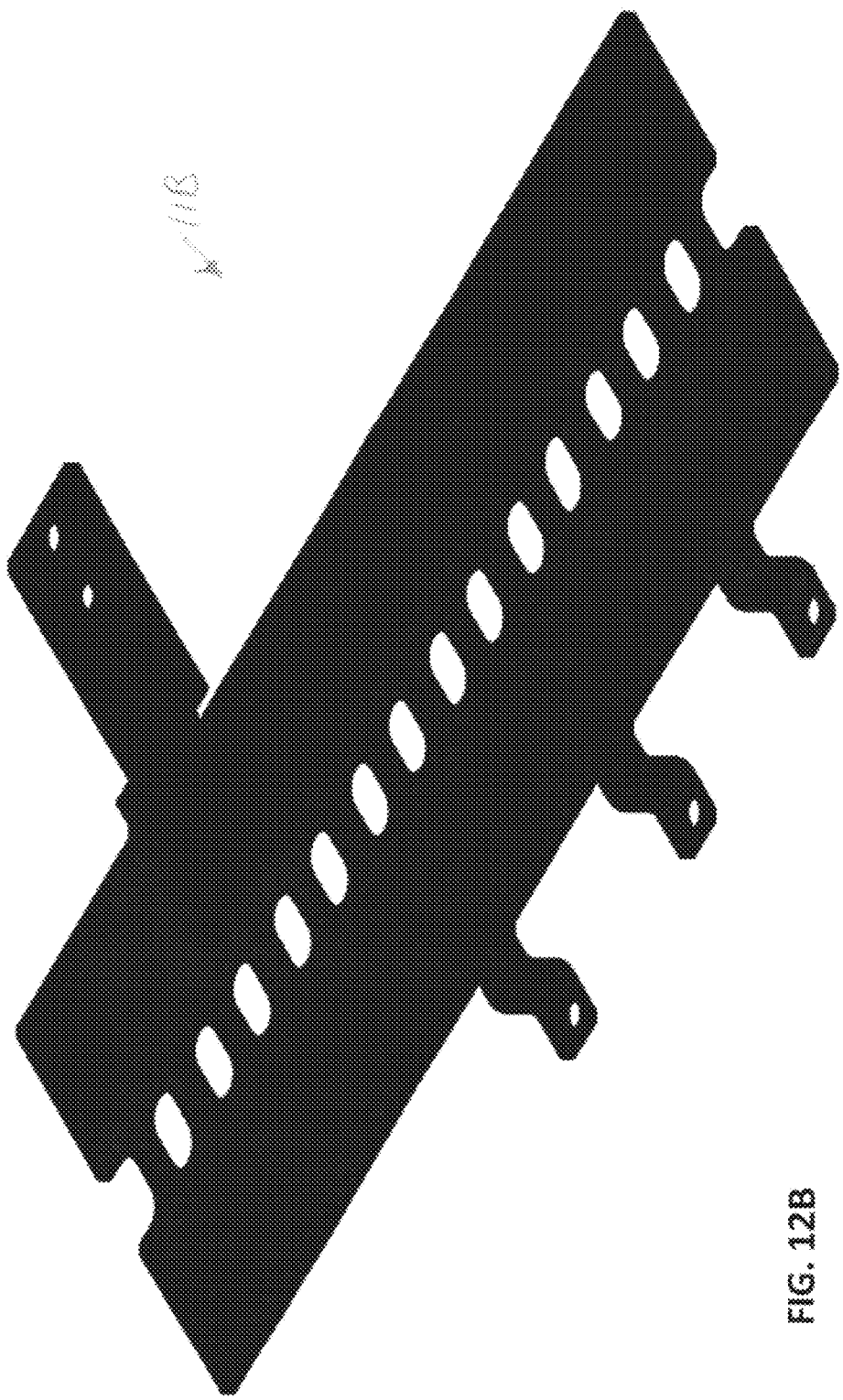
FIG. 12B is a view of a DC− busbar, in accordance with some embodiments.

In some embodiments, the IGBTs 130 function as high power switches. Although IGBTs are shown and described, other high power semiconductor switching devices can equally apply. The 130 include a plurality of connectors or terminals 132, for example, single for coupling a DC+ bus bar 111A and DC− bus bar 111B (see FIGS. 12A and 12B) to the IGBTs 130. AC terminals 123 are also provided.

The gate driver board 140 is coupled to the gates of the IGBTs 130. An external controller (not shown) can provide control signals to the gate driver board 140 so that the gate driver board 140 can control the operating mode of the IGBTs 130, for example, convert the DC voltage applied from the capacitor bank 110 to AC, where resulting AC is output from the converter 10 via AC terminals 123, or other operating modes where the IGBTs 130 convert an AC input into DC, or convert a DC input into DC. The controller may be include a special purpose computer processor and memory for processing signals that are output to the IGBTs 130 for performing a conversion function according to an operating mode identified in the received signals. For example, the signals may include electronic data that indicate whether the operating mode instructs the IGBTs 130 to perform a DC to AC conversion, AC to DC conversion, and/or a DC to DC conversion. Thus, a same hardware apparatus may be used to capture multiple operating modes.

Figure 11:
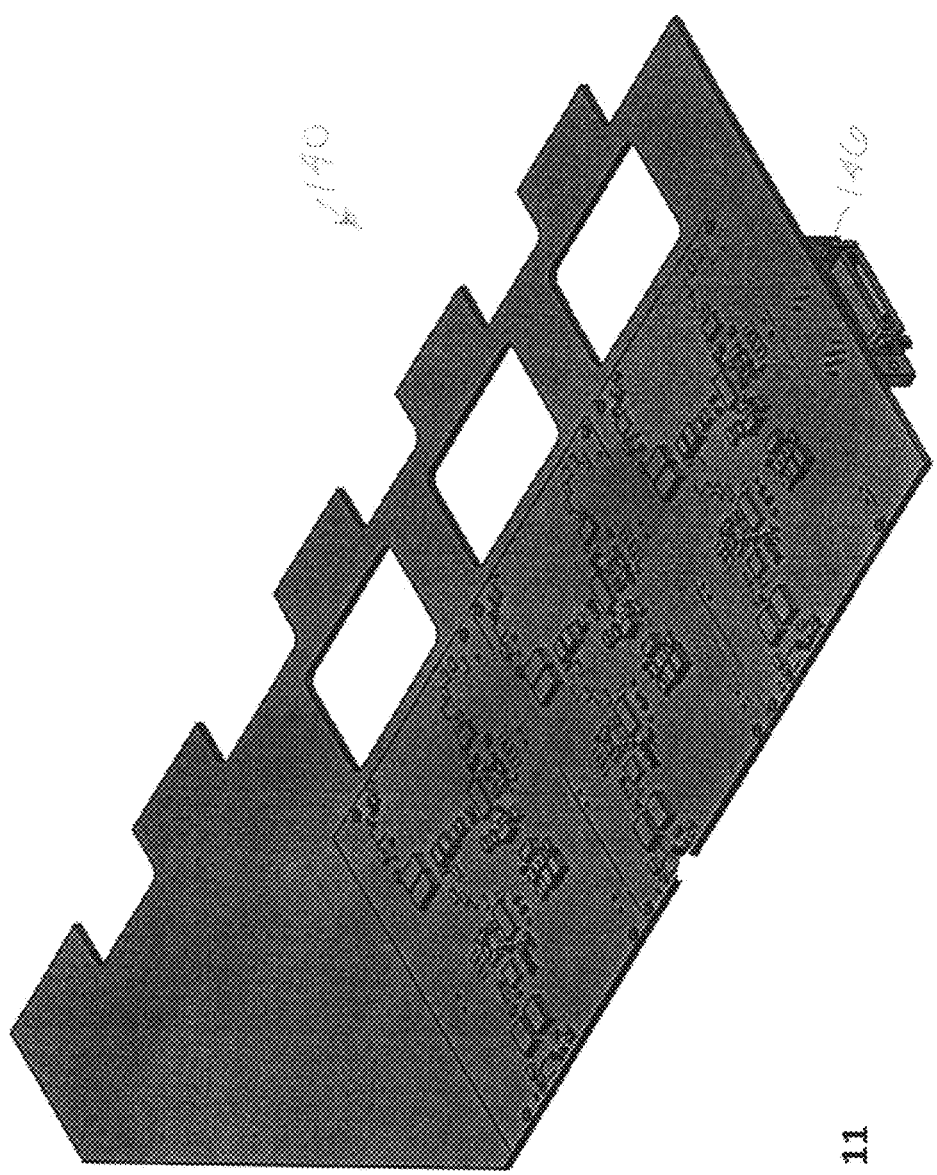
FIG. 11 is a view of a gate driver, in accordance with some embodiments.

In embodiments where the IGBTs 130 convert a received DC voltage to AC, output terminals 111A, 111B (see FIG. 5) are referred to as DC output terminals for exchanging DC signals with the capacitor bank 110. In some embodiments, DC output terminals 111A, 111B are part of a DC+ busbar and DC− busbar, respectively. As shown in FIG. 11, the gate driver board 140 can include a control connector 146, which is used to pass the switching signals to the gate driver and pass state information back to the controller. The controller may generate signals that command the gate driver to open and close the IGBT modules 130, and can process received signals regarding device temperature, voltage, or the like for a desired user purpose. The DC− busbar 111B may be coupled to the gate driver board 140 by one or more connectors 141, for example, screws.

The IGBTs 130 may be mounted to the cold plate 125. The cold plate 125 is preferably a liquid cooling cold plate that provides a flow path provided by coolant fittings 131 that move liquid under the IGBTs 130. The capacitors 110 and IGBTs 130 may generate a significant amount of heat. After heat generated by these components, and possibly other components of the converter 10, is absorbed into the liquid, the heated liquid is removed via cooling fitting 131 coupled to an attached hose (not shown). Cooling fluid may include water and/or other refrigerant liquid. In some embodiments, the IGBTs 130 can be positioned on an air cooled heat sink, instead of a liquid cooled heat sink.

Figure 13:
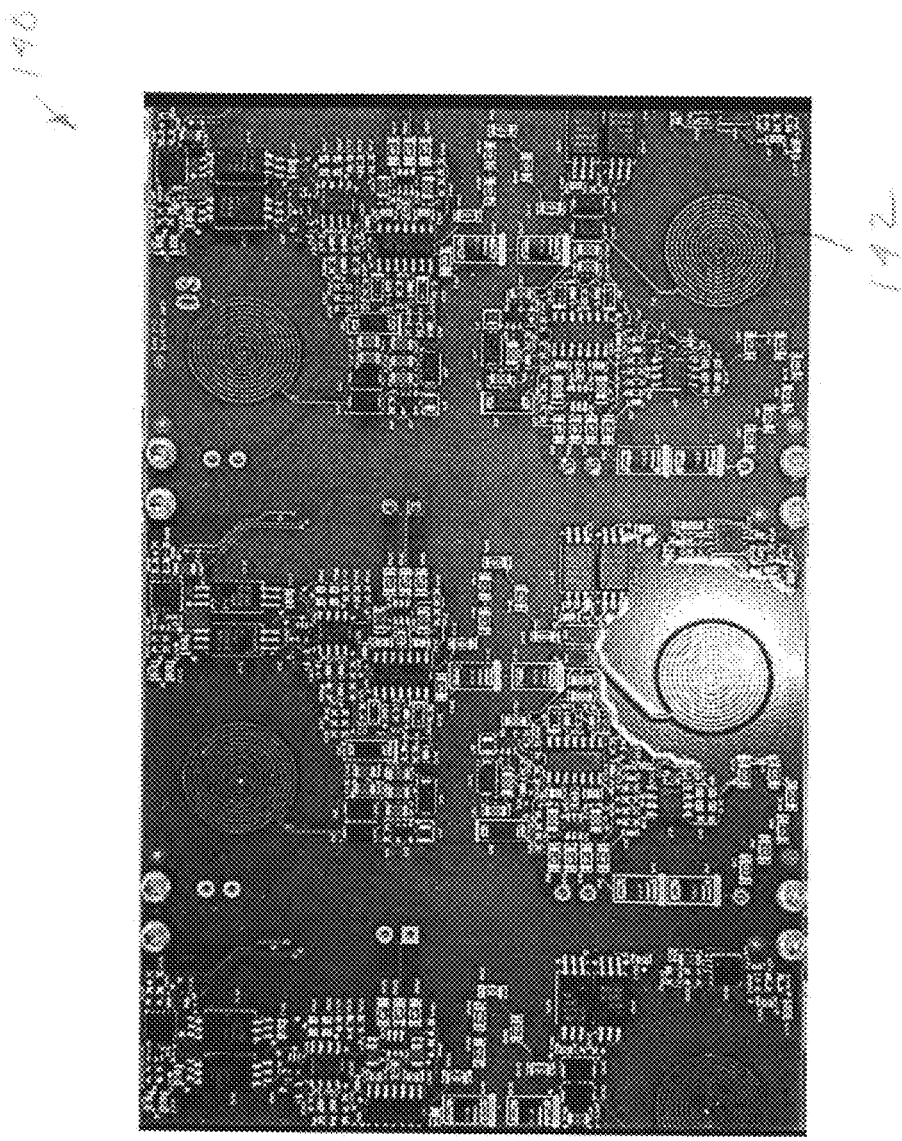
FIG. 13 is a view of a gate board module, in accordance with some embodiments.

The gate driver board 140 preferably includes planar transformers 142 (see for example FIG. 13) etched into the board instead of discrete components, and uses a single edge connector and serial communications to eliminate the need to access to the top of the board. This allows for a low inductance connection between capacitors 110 and IGBTs 130. The transformer may or may not include a core. In particular, it is desirable to position capacitors 110 close to the IGBTs 130 to limit inductance between electrical conductors of the invertor 10. At region as shown in FIG. 1A, inductance may be reduced between the capacitors 110 and IGBT terminals. As shown in FIGS. 1B and 13, the presence of planar transformers permit a reduced distance (d) between the gate driver board 140 and the capacitor bank 110.

Figure 9:
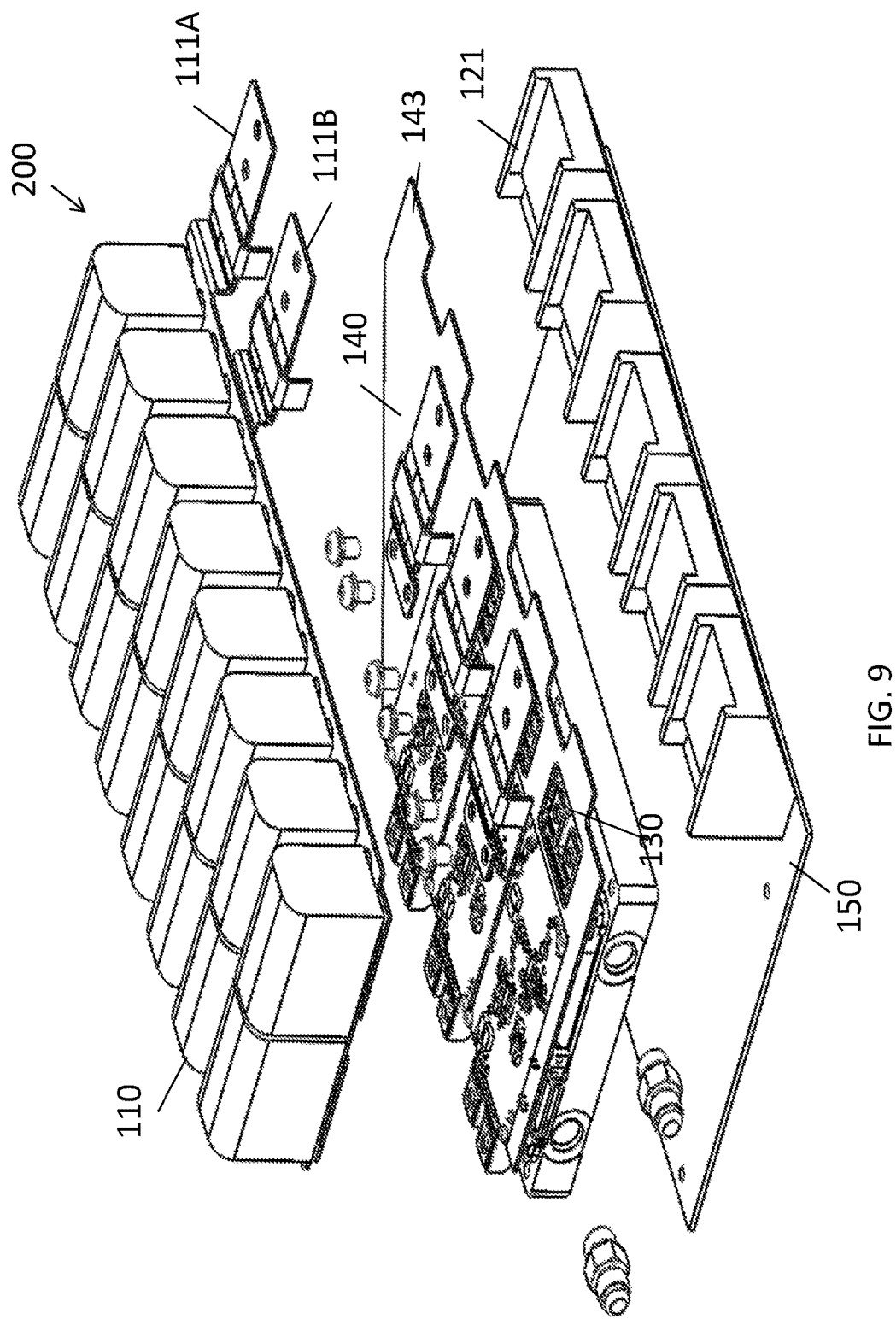
FIG. 9 is an exploded isometric view of an converter, in accordance with other embodiments.

FIG. 9 is an exploded isometric view of an inverter 200, in accordance with other embodiments.

FIGS. 10A-10K are isometric views of steps of a method for assembling an inverter 300, in accordance with some embodiments. The inverter 300 may be generally similar to inverters 10 and 200 described herein, but may include some differences with respect to the shape, configuration, and/or function of its components, and/or the presence or absence of components.

Figure 10A:
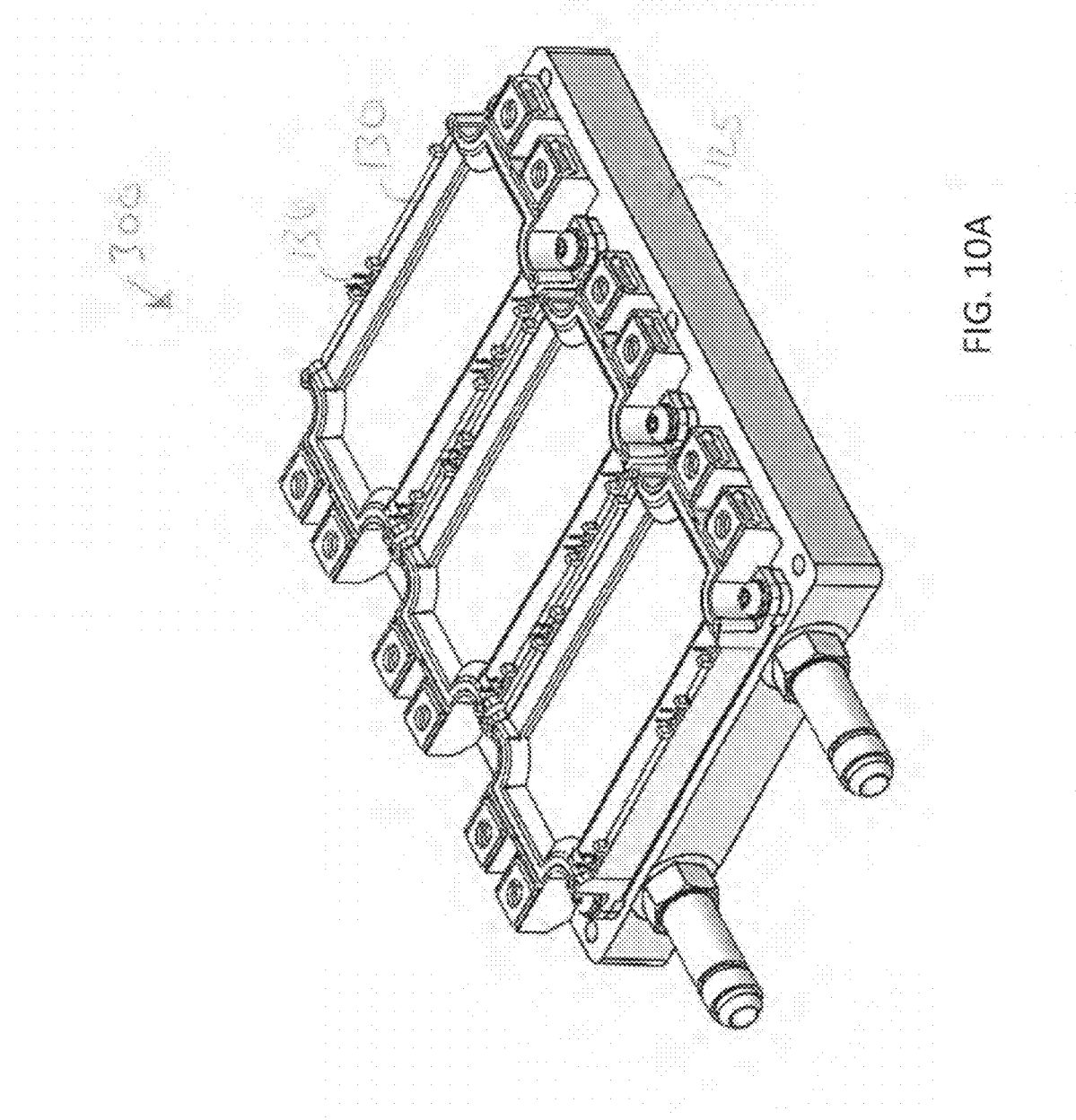

At FIG. 10A, three IGBTs 130 are coupled to a cold plate 125, for example, using screws or other coupling devices. Thermal grease or the like may applied to the IGBTs 130 as part of the installation.

Figure 10B:
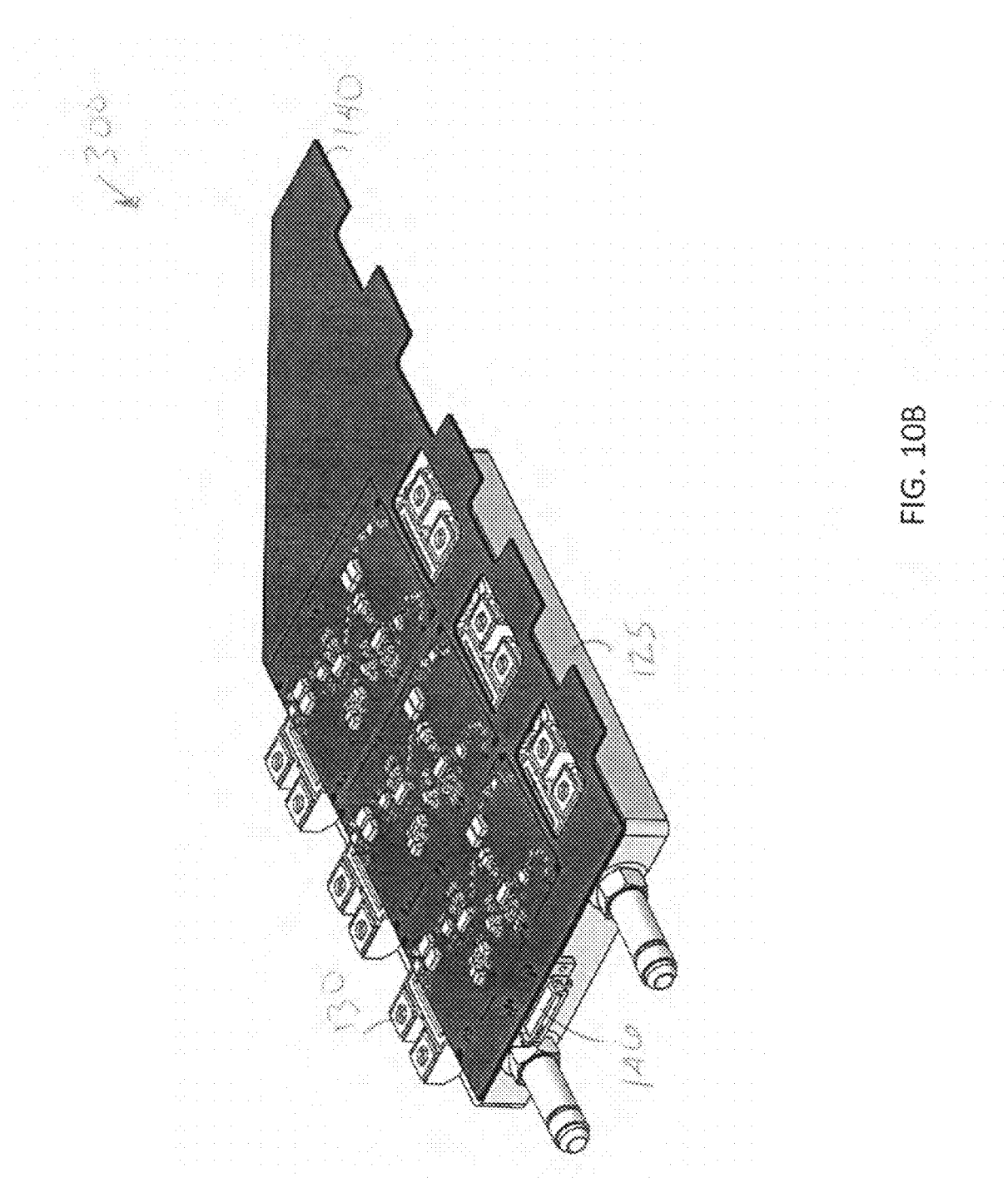

At FIG. 10B, a gate driver board 140 is coupled to the IGBTS 130. This can be achieved by press-fit pins 136 or related coupling mechanisms aligned with the gate driver board 140. The gate driver board 140 can be screwed into the IGBTs.

Figure 10C:
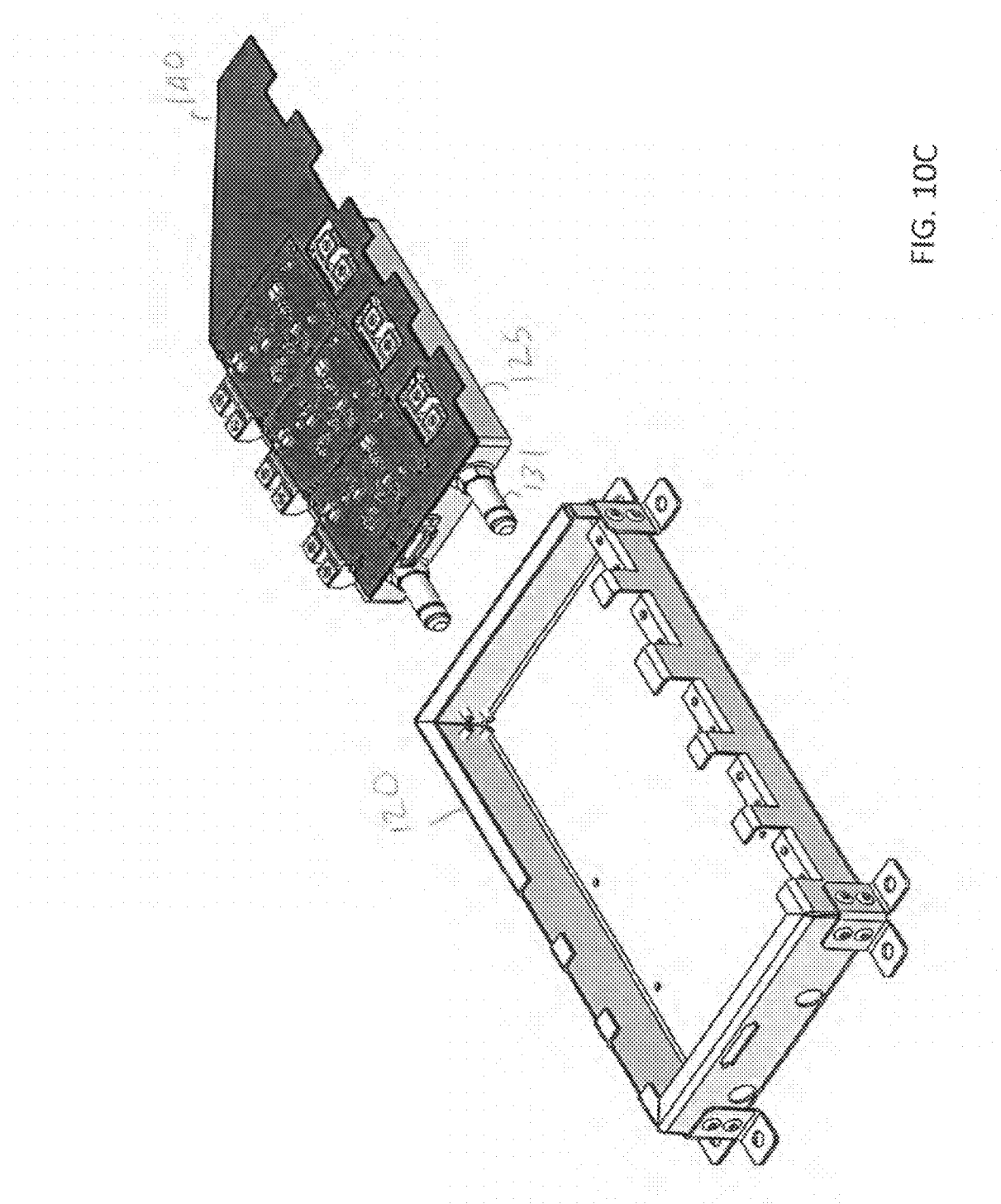

At FIGS. 10C and 10D, a plurality of terminal blocks 121 are inserted into a case 120, for example, in notches, openings, or the like in the case 120, and coupled to the case 120, for example, using screws, or other fastening devices. In other embodiments, for example, shown in FIGS. 1A-1F, the terminal blocks 121 may be coupled to a substrate or related sheet on which the cold plate 125 and other elements of the inverter are coupled.

Figure 10E:
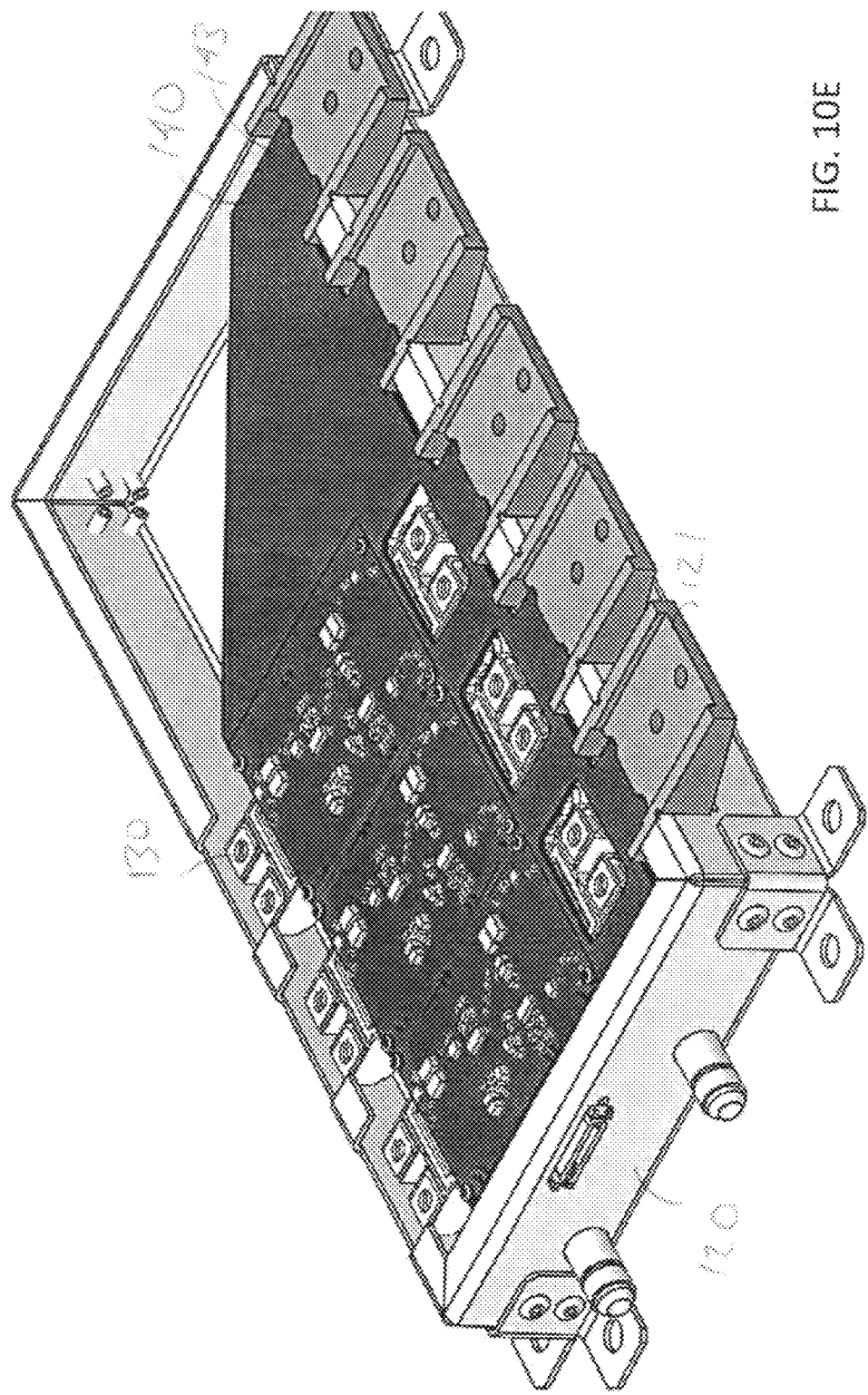
Figure 10F:
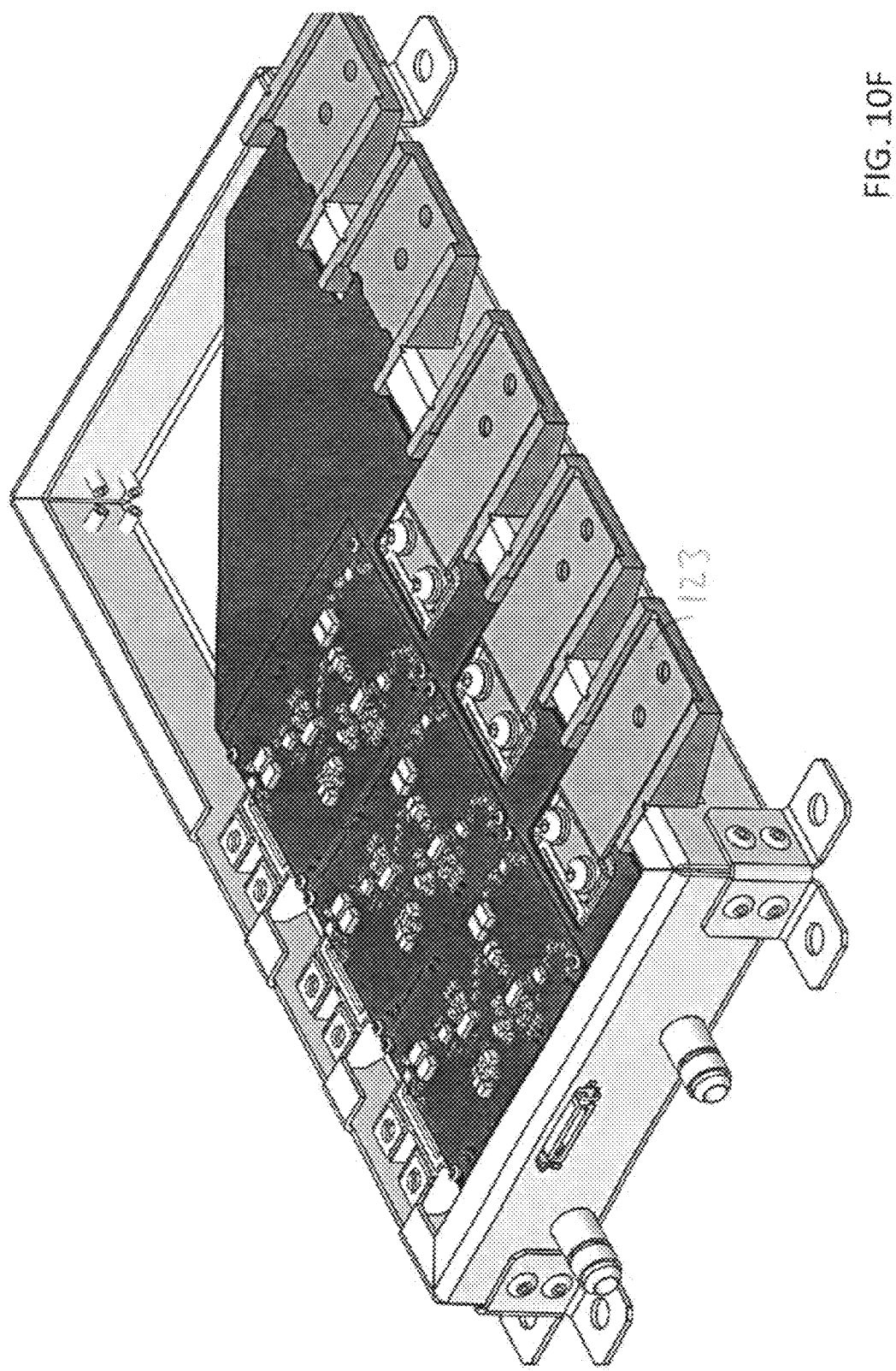
Figure 10G:
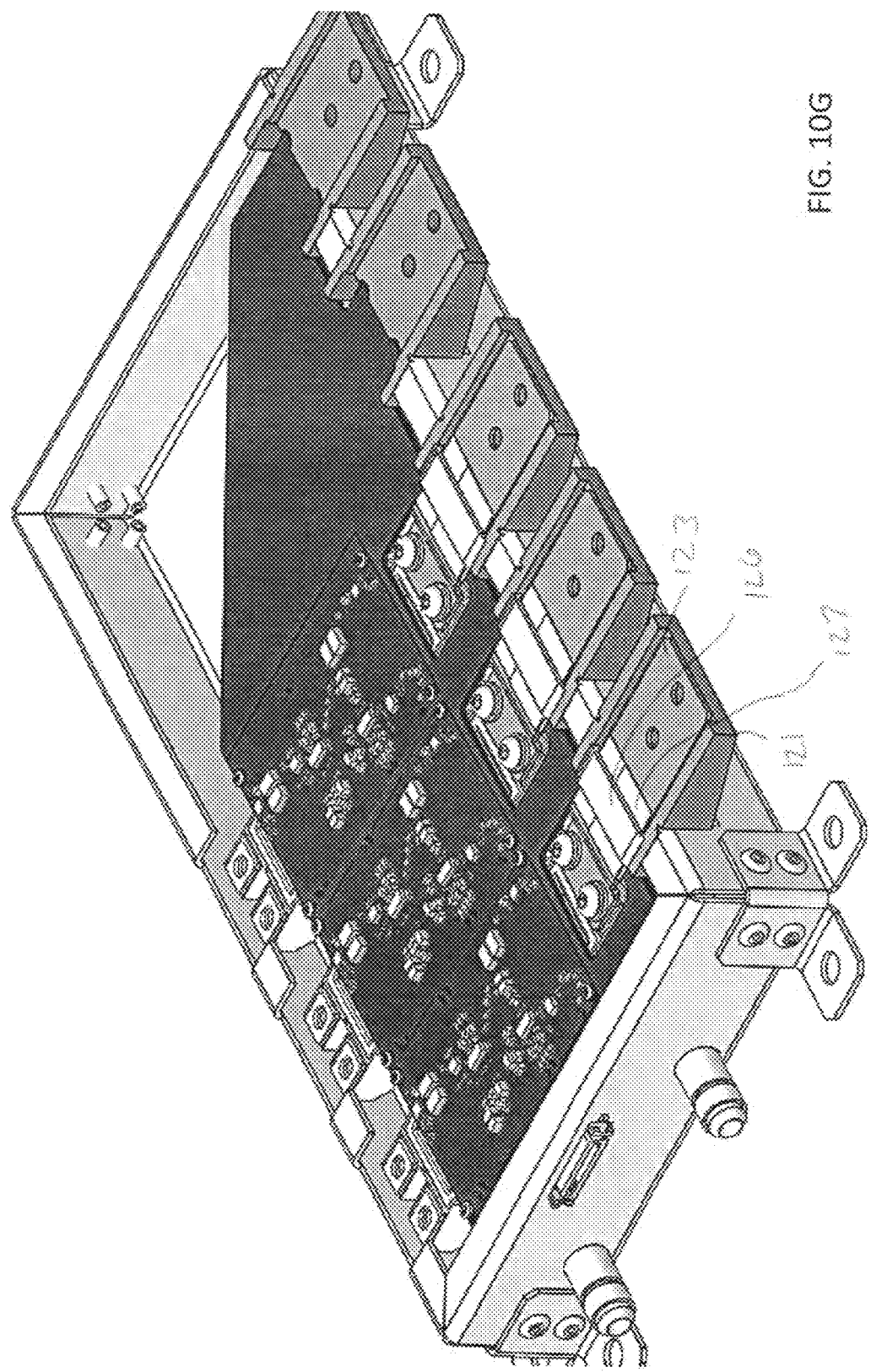

At FIG. 10E, the combination of cold plate 125 and IGBTs 130, and gate driver module, or board, 140 is coupled to the case 120. As shown in FIGS. 4, 9, and 10B-10K, the gate driver module 140 may include current sensor areas constructed as extensions 143 or the like that align with and are inserted in the terminal blocks 121. Here, the gate driver module 140 can include three IGBT modules and process current sensing for five output terminals at the extensions 143, or protrusions, but this configuration is not limited thereto. In other embodiments, for example shown in FIGS. 6-8, the gate driver module 140 has a rectangular shape. The extensions 143 incorporate current sensing functions, and may apply to both DC connections and the connections. At FIG. 10F, the terminal blocks 121 may include output terminals 123, referred to as AC terminals, and for outputting a voltage and current from the converter 10. The AC terminals 123 are coupled to the IGBTs 130, for providing an electrical path from the IGBTs to the AC terminals 123. At FIG. 10G, AC current sensor shields 126 and insulators 127 are installed on the AC terminals 123. The insulators isolate output voltage from signal level systems and the shields concentrate the magnetic flux and reduce crosstalk to improve sensor performance.

Figure 10H:
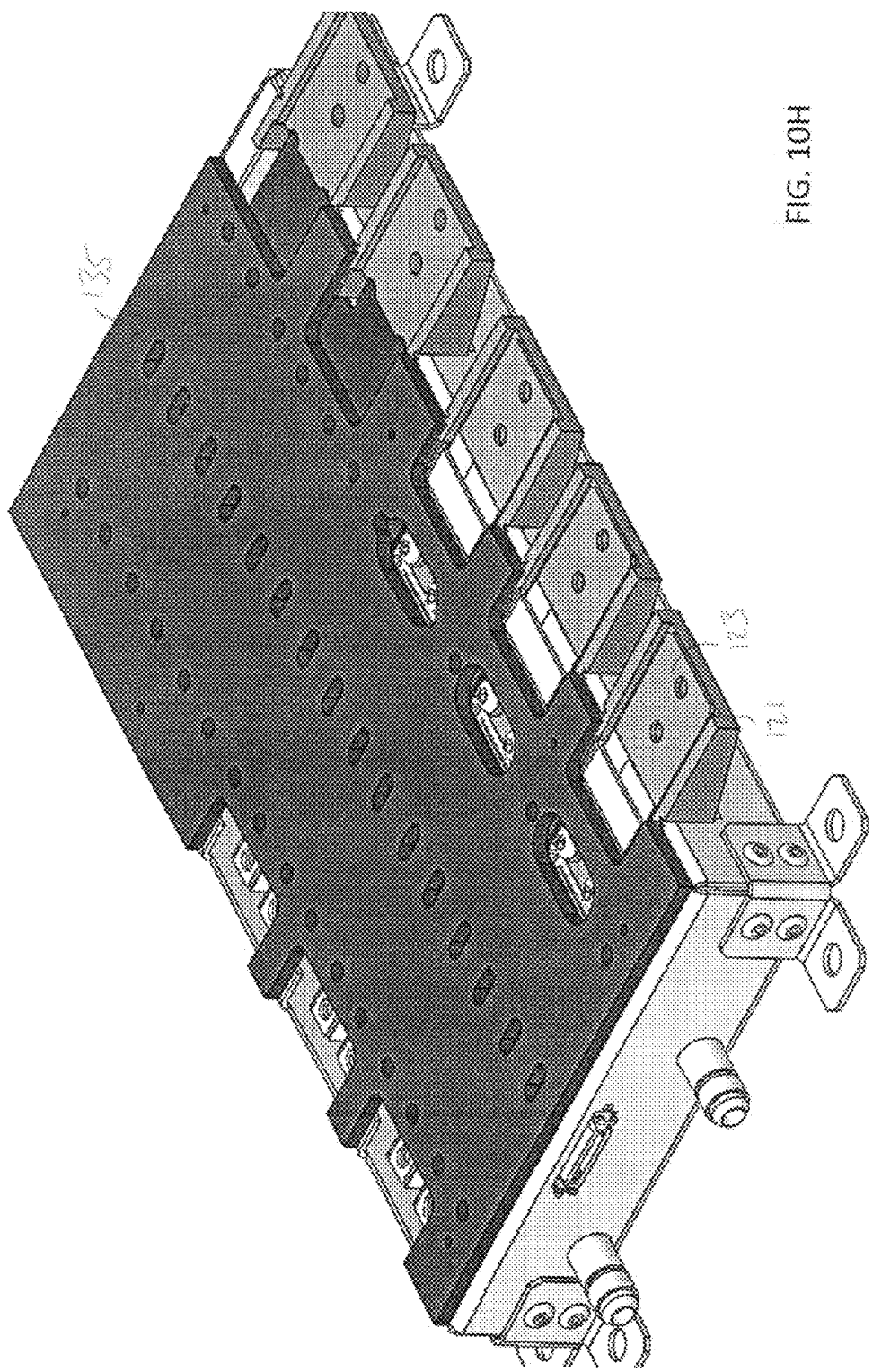
Figure 10J:
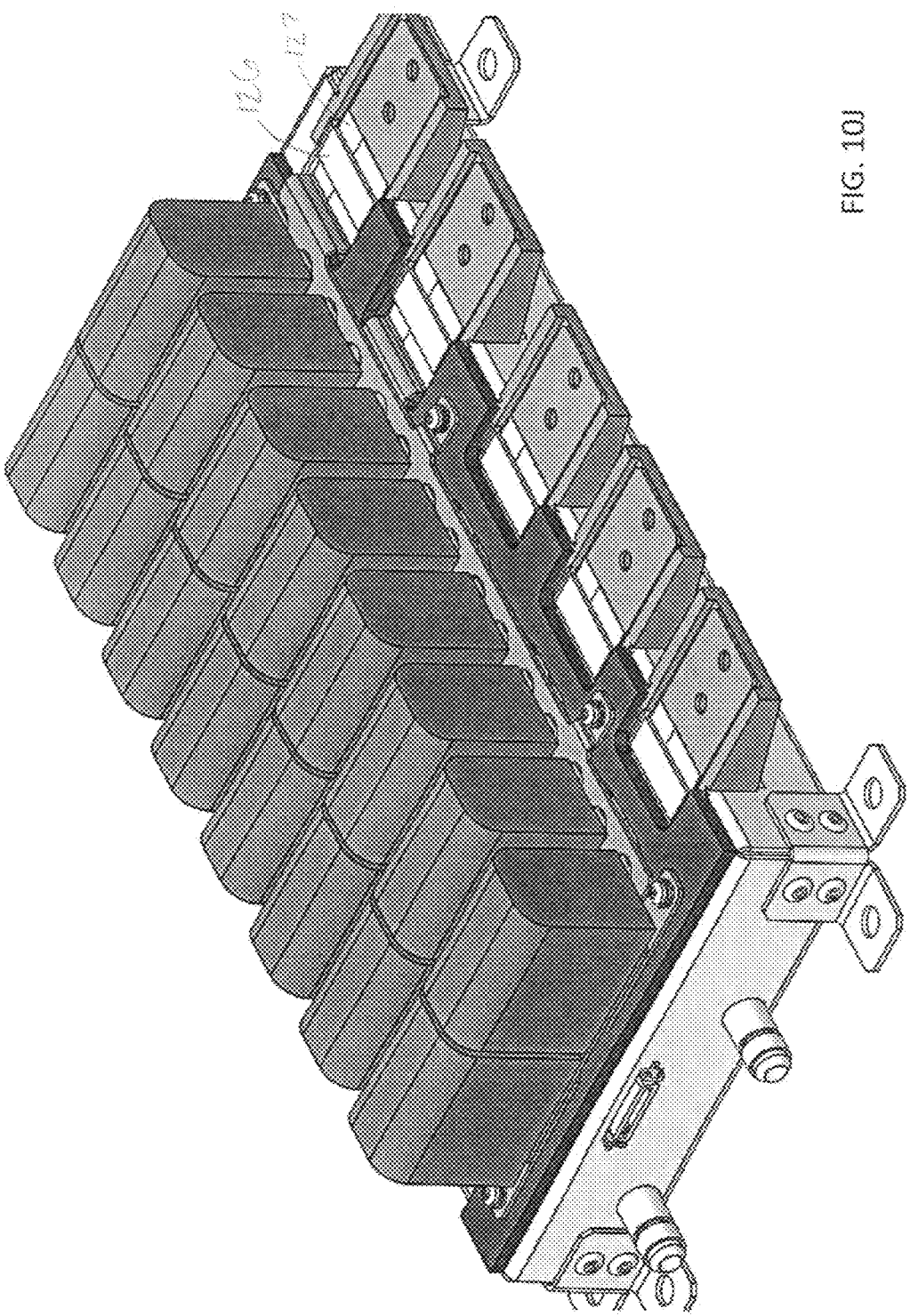

At FIG. 10H, a capacitor bank mount 135 is installed, which provides mechanical support. At FIG. 10I, a capacitor bank 110 is installed, or coupled to the capacitor bank mount 135. The capacitor bank 110 and capacitor bank mount 135 in turn are coupled to the case 120, for example, using screws or other coupling devices, adhesives, and so on. Here, a DC+ busbar and DC− busbar are positioned in two remaining terminal blocks 121 not occupied by the AC terminals 123. Output terminals of the DC+ busbar 111A and DC− busbar 111B, respectively, are referred to as DC terminals for exchanging DC signals with the capacitor bank 110. At FIG. 10J, DC current sensor shields 126 and insulators 127 are installed in the terminal blocks 121 over the DC+ busbar 111A and DC− busbar 111B, and may be similar as the sensor shields 126 and insulators 127 of FIG. 10G. This configuration permits inductance to be reduced between the capacitors 110 and IGBT due to the short distance between the capacitors 110 and IGBT terminals.

Figure 10K:
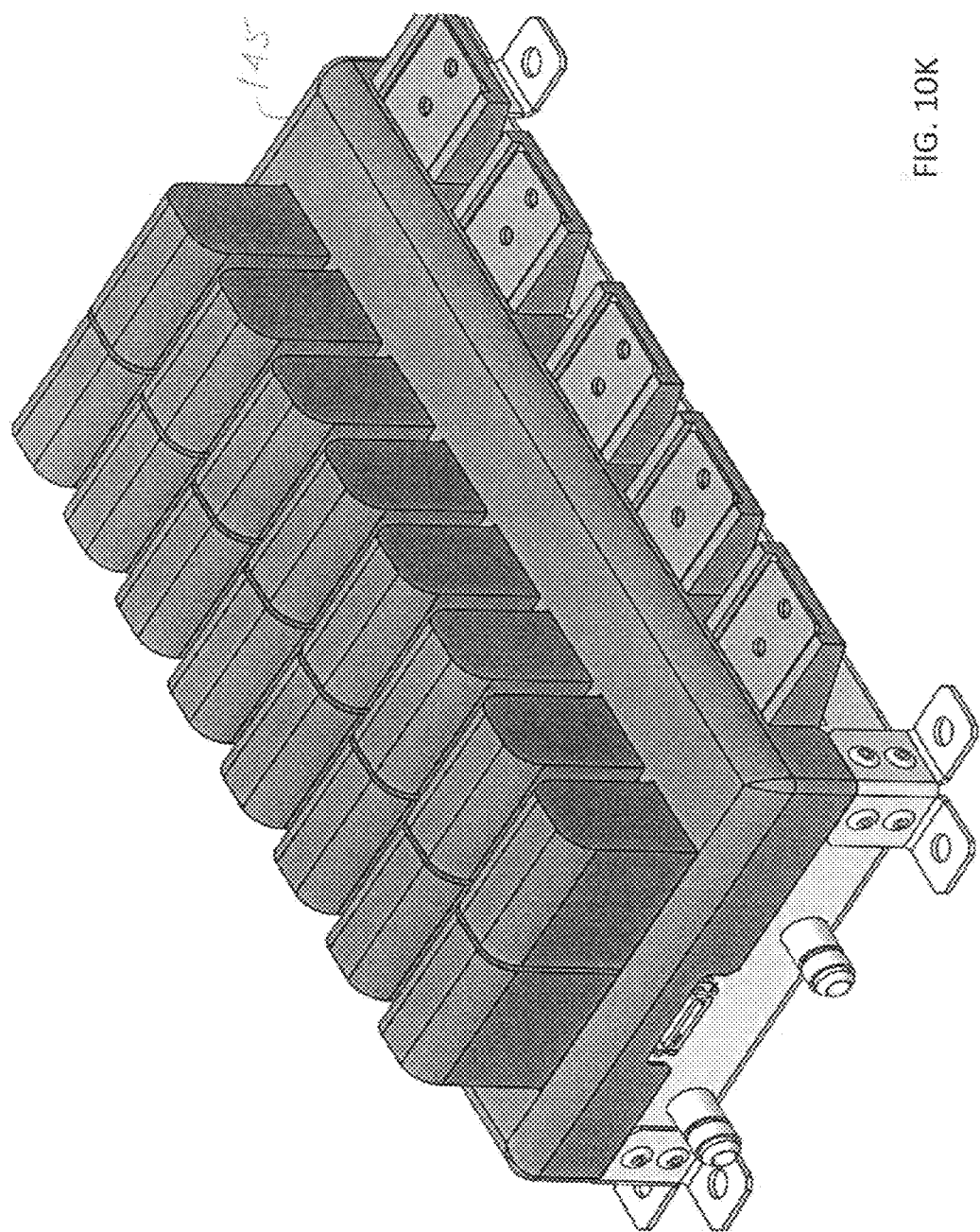

At FIG. 10K a top cover 145 is installed, or more specifically, coupled to the case 120 using screws, adhesives, or other coupling devices.

Figure 14:
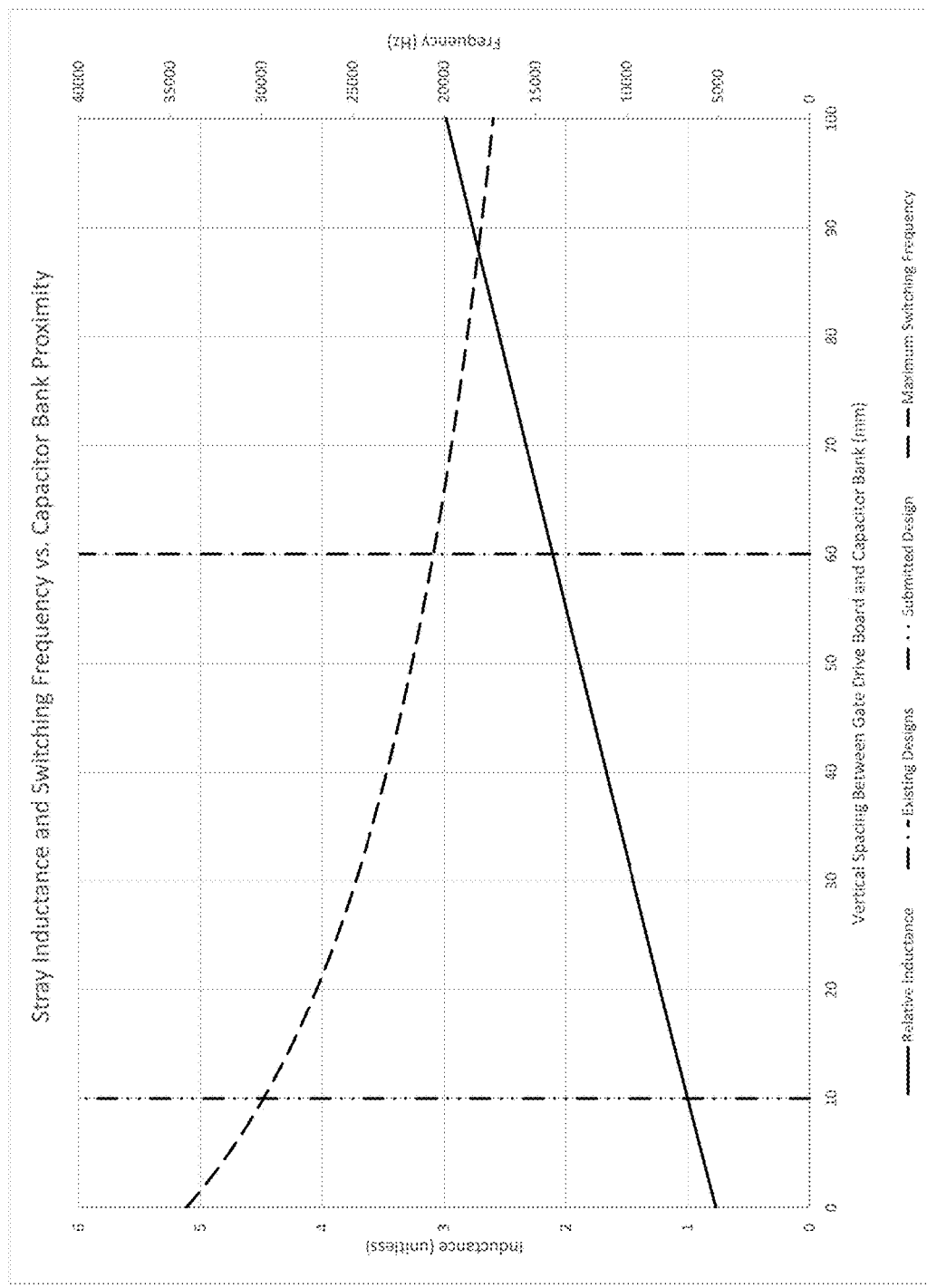
FIG. 14 is a graph showing an effect of spacing between a gate drive and a capacitor bank on a DC Bus inductance and a maximum switching frequency of a converter, in accordance with some embodiments.

FIG. 14 is a graph showing an effect of spacing between a gate drive and a capacitor bank on a DC Bus inductance and a maximum switching frequency of a converter, in accordance with some embodiments. Higher frequencies allow for cleaner output waveforms and exceeding the maximum shown in the graph plot may create a destructive resonance within the converter. A benefit of improving inductance is that this inductance may create a voltage spike across the switching device when is inactive, for example, it turns off. Reducing the inductance in this manner may proportionally reduce the undesirable spike, improving the lifetime of the switch and reducing electromagnetic interference (EMI) output from the device.

While concepts have been shown and described with reference to specific preferred embodiments, it should be understood by those skilled in the art that various changes in form and detail may be made therein without departing from the spirit and scope as defined by the following claims.

What is claimed is:

1. A power inverter, comprising:
a plurality of high power switching modules that form an alternating current (AC) output, the high power switching modules including a plurality of terminals for outputting the AC output;
a capacitor bank that provides a conditioned voltage to the high power switching modules for producing the AC output in response to receiving and storing electrical energy related to a direct current (DC) supply, the capacitor bank constructed and arranged to extend along a first plane; and
a gate driver module between the high power switching modules and the capacitor bank and extending along a second plane parallel the first plane, the gate driver module including a plurality of planar transformers for reducing a distance between the first plane of the capacitor bank and the second plane of the gate driver module.

2. The power inverter of claim 1, further comprising a case positioned over the high power switching modules, wherein the capacitor bank is mounted to the case for separating the first plane of the capacitor bank and the second plane of the gate driver module by the reduced distance.

3. The power inverter of claim 1, wherein the high power switching modules include insulated gate bipolar transistor (IGBT) modules.

4. The power inverter of claim 1, further comprising a bus bar extending over the gate
driver module and separating the capacitor bank from the gate driver module to reduce inductance between the capacitor bank and the high power switching modules.

5. The power inverter of claim 4, further comprising a plurality of sensor shields and insulators over the bus bar.

6. The power inverter of claim 1, further comprising a plurality of terminal blocks coupled to the case, wherein a combination of AC output terminals in communication with the high power switching modules and DC output terminals in communication with the capacitor bank are positioned in the terminal blocks.

7. A power converter, comprising:
a plurality of insulated gate bipolar transistor (IGBT) modules that convert one form of electrical current to another form of electrical current according to an operating mode;
a plurality of terminals for outputting the converted form of electrical current; and
a gate driver module at a top region of the high power switching modules; and
a capacitor bank that extends along a first plane and provides a conditioned voltage to the IGBT modules for producing an AC output in response to receiving and storing electrical energy related to a direct current (DC) supply, wherein the gate driver module extends along a second plane parallel the first plane of the capacitor bank, and includes a plurality of planar transformers for reducing a distance between the first plane of the capacitor bank and the second plane of the gate driver module parallel the first plane.

8. The power converter of claim 7, wherein the operating mode is an inverter operating mode, wherein the IGBT modules outputs an alternating current (AC) in response to a received source of direct current (DC).

9. The power converter of claim 7, wherein the operating mode is a rectifier operating mode, wherein the IGBT modules outputs a direct current (DC) in response to a source of alternating current (AC).

10. The power converter of claim 7, wherein the operating mode is a DC/DC operating mode.

11. The power converter of claim 7, wherein the gate driver receives command signals from an external controller, and wherein the command signals are used by the IGBT modules to establish the operating mode.

12. A power inverter, comprising:
a plurality of high power switching modules that form an alternating current (AC) output;
a capacitor bank that provides a conditioned voltage to the high power switching modules for producing the AC output in response to receiving and storing electrical energy related to a direct current (DC) supply, the capacitor bank constructed and arranged to extend along a first plane;
a gate driver module between the high power switching modules and the capacitor bank and extending along a second plane parallel the first plane, the gate driver module including a plurality of planar transformers along the second plane for reducing a distance between the first plane of the capacitor bank and the second plane of the gate driver module; and
a case positioned over the high power switching modules, wherein the capacitor bank is mounted to the case, and positioned over the high power switching modules so that the high power switching terminals are proximal the capacitor bank.

13. The power inverter of claim 12, further comprising a cold plate or heat sink on an opposite side of the case as the capacitor bank, wherein the high power switching modules are positioned on the cold plate or heat sink.

14. The power inverter of claim 12, wherein the gate driver module comprises a control connector that exchanges signals between the gate driver module and a controller.

15. The power inverter of claim 12, further comprising a DC bus bar, wherein the high power switching modules are on a first side of the DC bus bar and the capacitor bank is on the other side of the DC bus bar.

16. The power inverter of claim 15, wherein the DC bus bar extends over the gate driver module and separates the capacitor bank from the gate driver module to reduce inductance between the capacitor bank and the high power switching modules.

* * * * *